United States Patent
Komori et al.

(10) Patent No.: US 6,265,242 B1
(45) Date of Patent: Jul. 24, 2001

(54) SOLAR CELL MODULE AND A PROCESS FOR PRODUCING SAID SOLAR CELL MODULE

(75) Inventors: Ayako Komori, Jouyou; Tsutomu Murakami, Nara; Akiharu Takabayashi, Nara; Takehito Yoshino, Nara; Masahiro Mori, Soura-gun; Koji Tsuzuki, Ikoma; Takeshi Takada, Kyotanabe; Yoshifumi Takeyama, Soura-gun; Koichi Shimizu; Masaaki Matsushita, both of Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/255,842

(22) Filed: Feb. 23, 1999

(30) Foreign Application Priority Data

Feb. 23, 1998 (JP) ................................. 10-040235

(51) Int. Cl.[7] ................................................ H01L 31/042
(52) U.S. Cl. .............................. 438/66; 438/61; 438/67; 438/69; 438/70; 438/72; 438/73; 438/80; 136/244; 136/246; 136/251; 136/252; 136/290; 136/291; 257/428; 257/431; 257/464
(58) Field of Search ........................ 136/244, 246, 136/251, 252, 290, 291; 438/61, 66, 67, 69, 70, 72, 73, 80; 257/428, 431, 464

(56) References Cited

U.S. PATENT DOCUMENTS

| | | | |
|---|---|---|---|
| 4,204,881 | * 5/1980 | McGrew | 136/246 |
| 4,776,893 | * 10/1988 | McLeod et al. | 136/244 |
| 5,213,626 | 5/1993 | Paetz | 136/244 |
| 5,514,223 | * 5/1996 | Vogeli | 136/244 |
| 5,779,817 | * 7/1998 | Wecker | 136/293 |

FOREIGN PATENT DOCUMENTS

| | | |
|---|---|---|
| 6-37343 | * 2/1994 | (JP) . |
| 9-217446 | 8/1997 | (JP) . |

* cited by examiner

*Primary Examiner*—Alan Diamond
(74) *Attorney, Agent, or Firm*—Fitzpatrick, Cella, Harper & Scinto

(57) ABSTRACT

A process for producing a solar cell module comprising at least a photovoltaic element module is provided. The photovoltaic element module is formed by electrically connecting a plurality of photovoltaic elements with each other, after the individual photovoltaic elements are identified or classified into a plurality of groups which are different from each other in property and attribute. The photovoltaic element module is formed such that at least two kinds of photovoltaic elements having different property and attribute co-exist therein. A solar cell module having at least a photovoltaic element module comprising a plurality of photovoltaic elements electrically connected with each other is also provided; the plurality of photovoltaic elements comprises photovoltaic elements identified or classified into at least two kinds which are different in terms of property and attribute.

28 Claims, 13 Drawing Sheets cross-sectional view along the A-A' line in FIG.5(A)

cross-sectional view along the B-B' line in FIG.5(A)

F I G. 6
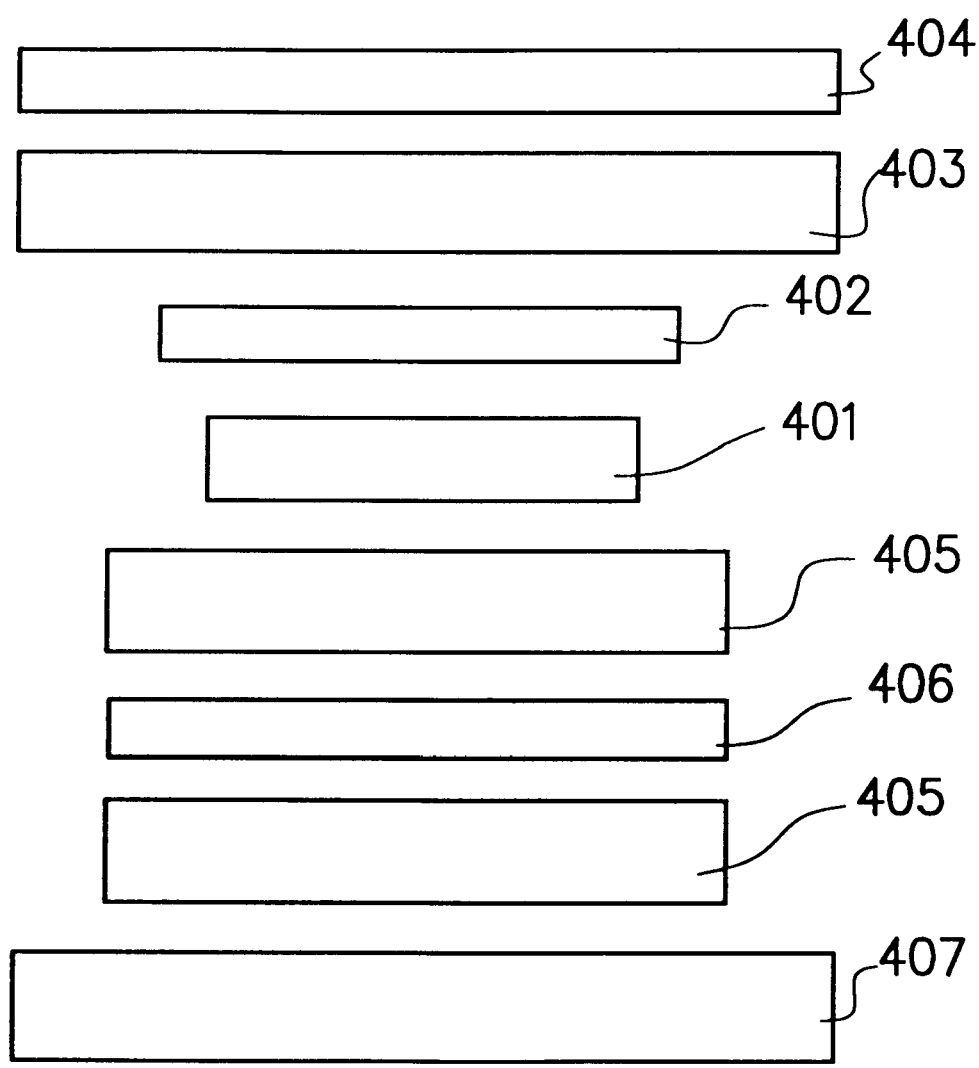

cross-sectional view along the C-C' line in FIG.7(A)

cross-sectional view along the D-D' line in FIG.8(A)

FIG. 10
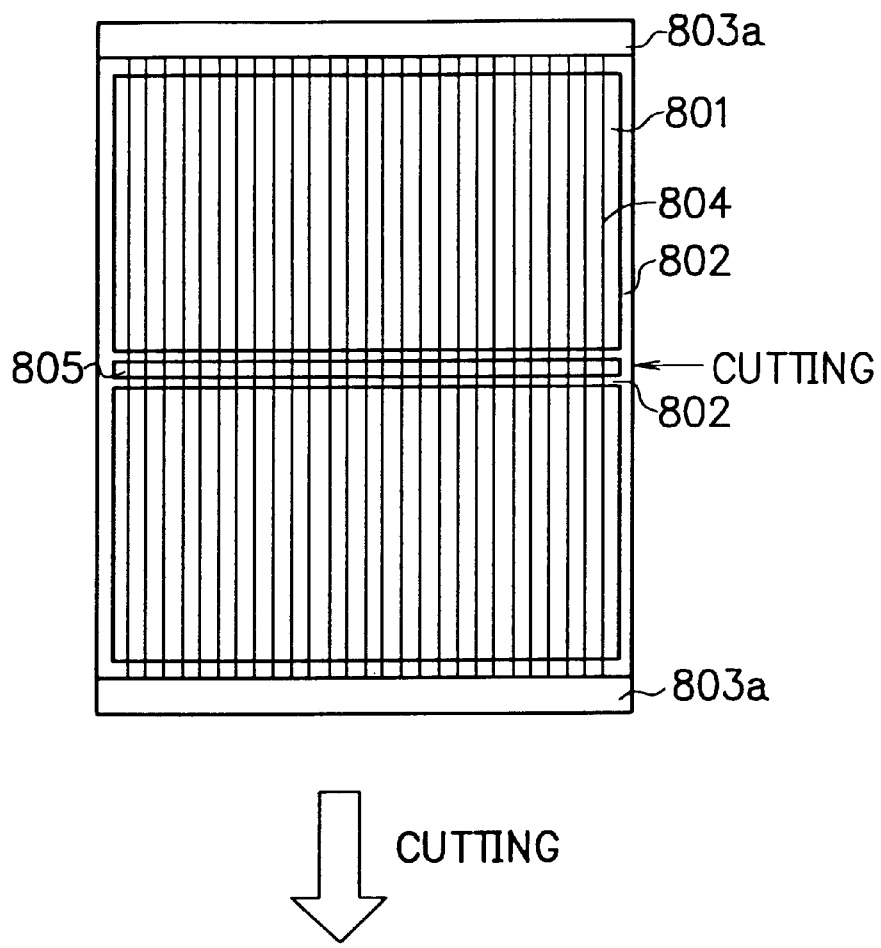
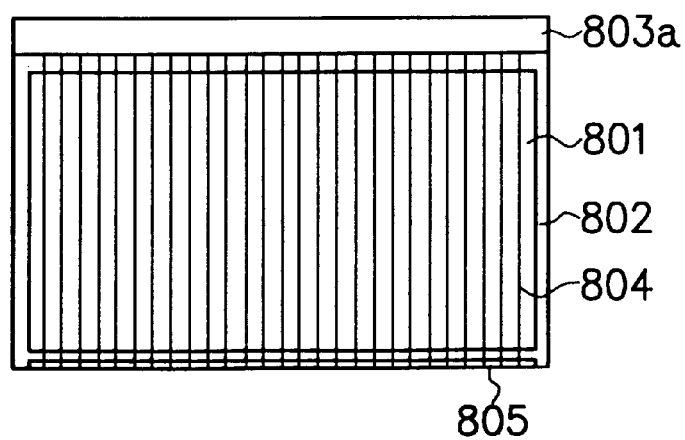

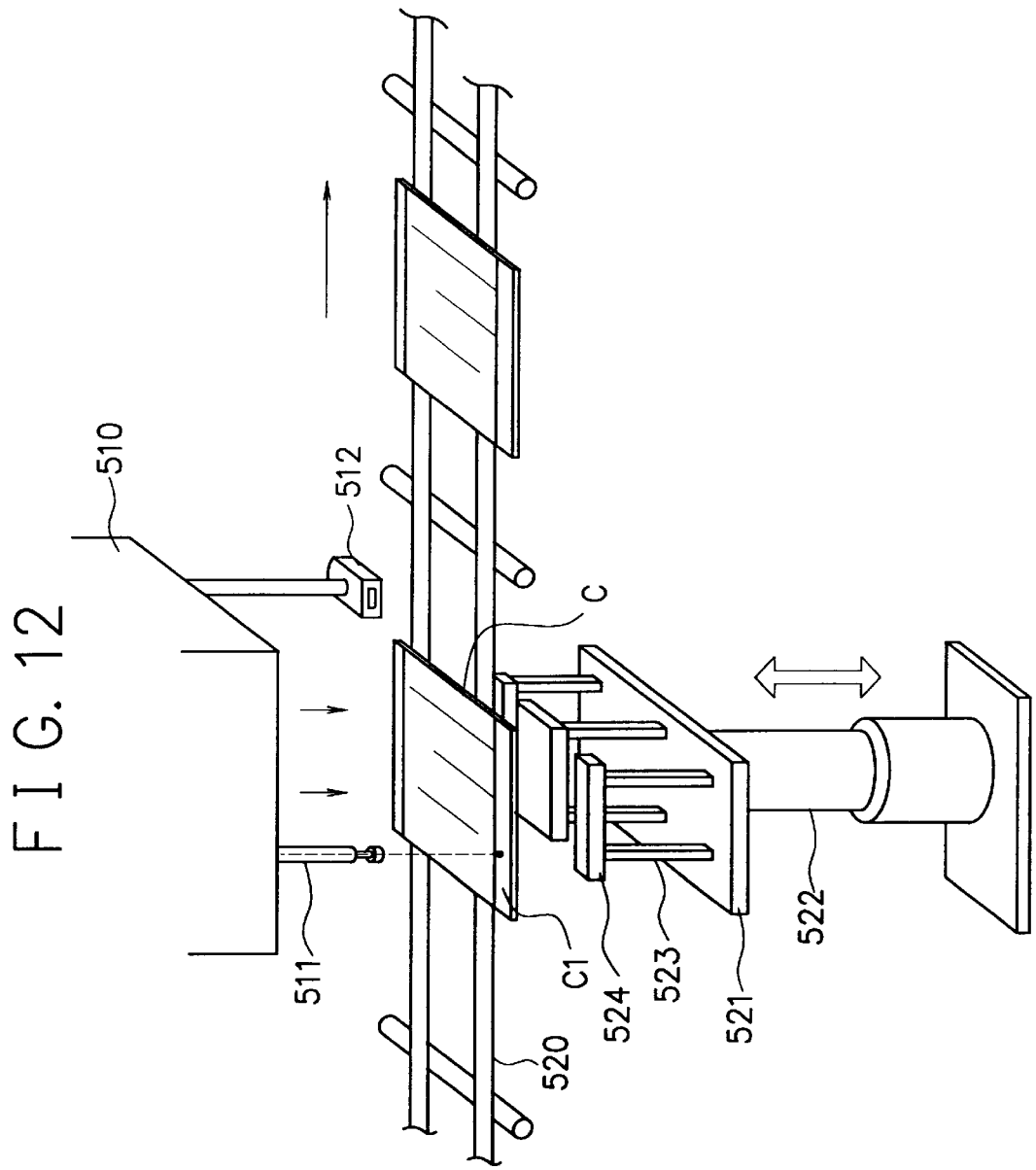

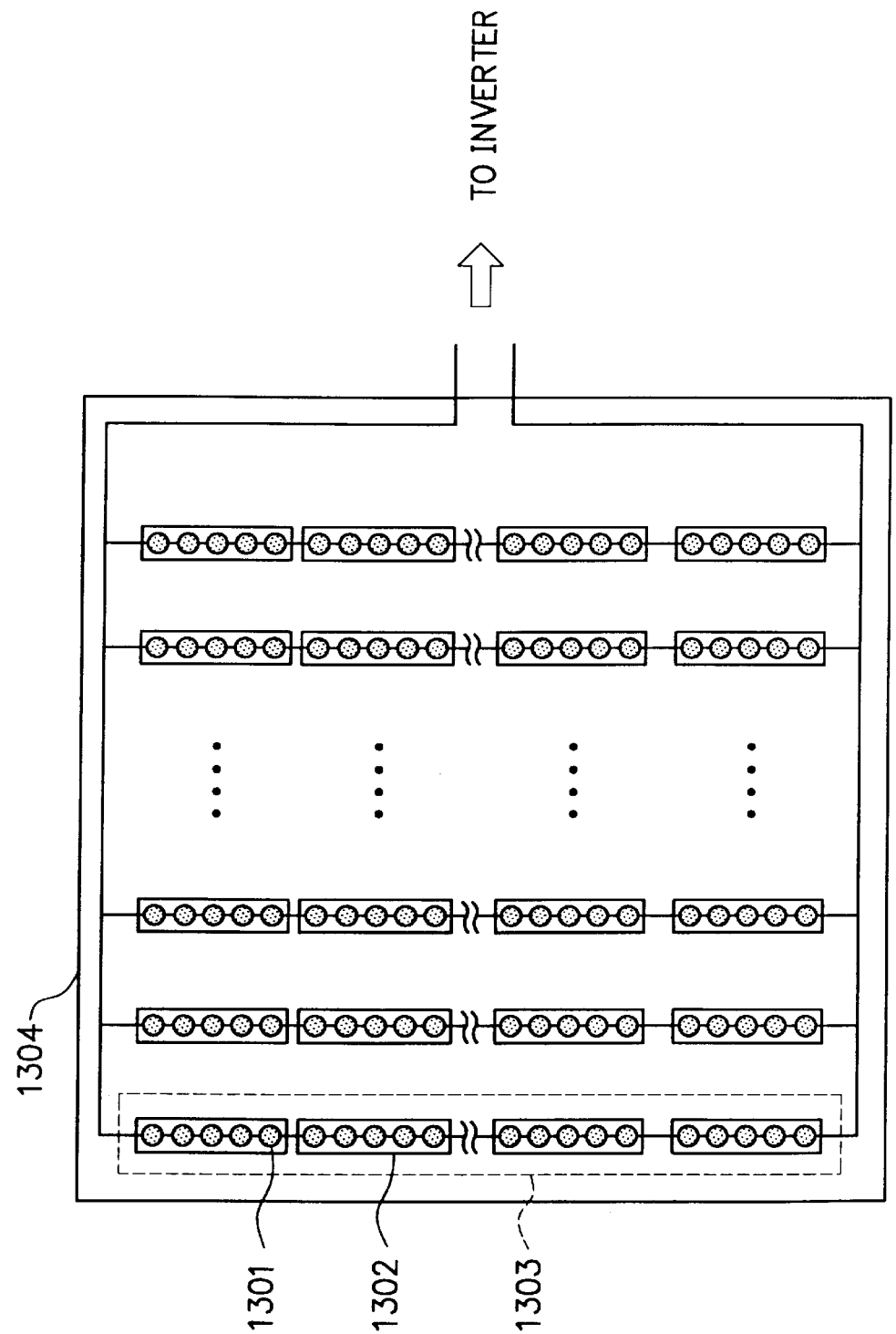

SOLAR CELL MODULE AND A PROCESS FOR PRODUCING SAID SOLAR CELL MODULE

BACKGROUND OF THE INVENTION

1. Field of the Invention

The present invention relates to a solar cell module and a process for producing said solar cell module. More particularly, the present invention relates to a solar cell module having a photovoltaic element module in which a plurality of photovoltaic elements (solar cells) are electrically connected with each other and a process for producing said solar cell module.

2. Related Background Art

In recent years, societal consciousness on the preservation of energy resources and the protection of environment has been increasing all over the world. Particularly there has been pointed out a fear for exhaustion of petroleum and the like as the energy resources. In addition, heating of the earth because of the so-called greenhouse effect due to an increase of atmospheric $CO_2$ has been predicted.

In view of this situation, solar cells (photoelectric conversion devices in other words) are greatly expected to be a future power generation source since they can directly convert sunlight which is a clean energy source into an electric power and supply said electric power without causing $CO_2$ buildup in the case of thermal power generation.

There have been proposed a variety of solar cells for commercial and home appliances. These solar cells include solar cells in which crystalline series silicon materials are used (these solar cells will be hereinafter referred to as crystalline series solar cell) and solar cells in which amorphous silicon materials are used (these solar cells will be hereinafter referred to as amorphous silicon solar cell). The amorphous silicon solar cell is more advantageous in comparison with the crystalline series solar cell because the semiconductor photoactive layer of the former which is composed of an amorphous silicon material (a—Si) can be easily and continuously formed in a large area and in a desired form by a relatively simple process, where the energy consumed in the formation of the semiconductor photoactive layer is relatively small, and therefore, the amorphous silicon solar cell can be produced at a reasonable production cost. In addition, for the amorphous silicon solar cell, its element thickness is as thin as about $1/1000$ of that of the crystalline series solar cell and therefore, the cost of a raw material used in the production of the amorphous silicon solar cell is desirably low. And the amorphous silicon solar cell can be readily designed into a solar cell module in a desired configuration which can be used as a power generation source.

Such amorphous silicon solar cell comprises a photovoltaic element which typically comprises a back reflecting layer, a semiconductor photoactive layer comprising an amorphous silicon material and a transparent electrode layer stacked in this order on a substrate such as a glass substrate or a flexible substrate. In the case of using a flexible substrate, there are advantages such that film formation thereon can be readily and continuously conducted and the resulting photovoltaic element is light and excels in flexibility. The use of such photovoltaic element having these advantages enables one to produce a light weight solar cell module. In this connection, a proper flexible member is often used as the substrate in the production of an amorphous silicon photovoltaic element.

The production of a solar cell module using such amorphous silicon photovoltaic element is usually conducted in a manner of providing a plurality of amorphous silicon photovoltaic elements, electrically connecting the amorphous silicon photovoltaic elements with each other into a photovoltaic element module, and sealing the photovoltaic element module by means of a sealing resin. Thus, there can be readily produced a desirable amorphous silicon solar cell module which is light weight and has flexibility at a reasonable production cost. In view of this, in recent years, an amorphous silicon solar cell module having such advantages as above described has been positively installed on a roof or wall of a building. In this case, the solar cell module is used as a building material by laminating a reinforcing member on its non-light receiving side (that is, the side opposite the light receiving side). By laminating the reinforcing member in this way, the physical strength of the solar cell module is improved and the solar cell module is prevented from being warped or distorted due to changes in the environmental temperature.

In order for such solar cell module to receive sunlight as much as possible, it is installed on a sunny place such as a roof of a building in many cases. In the case where the installation place is a building's sunny roof having a large area, there is employed a manner of arranging a plurality of such solar cell modules such that they are electrically connected with each other into a solar cell array.

By the way, in the process of mass-producing a plurality of photovoltaic elements, it is difficult to make all the photovoltaic elements produced be uniform in terms of property, where they are usually varied with respect to their properties and attributes. As related factors of causing this situation, there can be mentioned a variation in the thickness of the semiconductor photoactive layer, a deviation in the condition of forming the semiconductor photoactive layer, and a difference in the film-forming position upon forming the semiconductor photoactive layer, and the like.

As above described, in the case of producing a solar cell module, a plurality of given photovoltaic elements are electrically connected with each other. The electric characteristics of the resulting solar cell module depend on the properties of the respective photovoltaic elements. Here, in order to ensure the output of a solar cell module, there are presently prescribed standards for the output value of a photovoltaic element and that of a photovoltaic element module. Therefore, said photovoltaic elements and said solar cell module are generally produced in accordance with the above described standards.

Now, in the case of a solar cell module or a solar cell module string (which will be occasionally simply called "string" in the following) in which a plurality of photovoltaic elements are used as a unit in which these photovoltaic elements are electrically connected in series or parallel connection, when said photovoltaic elements are different from each other in terms of Pmax point, all the photovoltaic elements cannot be used at the same Pmax point. Therefore, a loss is unavoidably caused upon outputting an electric power. Similarly, in the case of a solar module array (which will be occasionally simply called "array" in the following) in which a plurality of solar cell module strings are electrically connected with each other in parallel connection, when these strings are different from each other in terms of Vpm (Pmax point voltage), it is a matter of course that all the strings cannot be used at the same Pmax point. In this case, a loss is also unavoidably caused upon outputting an electric power.

In order to prevent such drawback as above described from occurring, in the process of mass-producing a number of photovoltaic elements, it is required to constantly conduct the process control with circumspect care so that a variation does not occur among the photovoltaic elements obtained with respect to their properties. In this case, the period of time and the expenses required in order to conduct the process control in such a way as above described are of an extent which cannot be disregarded.

In the case where the photovoltaic elements obtained are such that some of them have different properties from those of the remaining photovoltaic elements, in many cases, these photovoltaic elements having different properties are treated, for instance, as will be described below.

(1) The photovoltaic elements having different properties are discarded. This situation results in a decrease in the yield.

(2) From the photovoltaic elements having different properties, the photovoltaic elements having the same properties are selected, and using these selected photovoltaic elements, a particular solar cell module array is prepared.

In any of the above treatments (1) and (2), extra expenses and extra treatment steps are necessitated. This situation results in an increase in the production cost of the solar cell modules as a whole.

In the case of continuously producing a photovoltaic element module by electrically connecting a plurality of photovoltaic elements, photovoltaic elements produced are sequentially connected in the order as produced. In this case, each adjacent photovoltaic elements situated next to each other are those produced in lots which are quite similar in terms of conditions relating to the film formation and film thickness. Particularly, the photovoltaic elements which are quite similar with respect to their properties and attributes are electrically connected with each other. In this case, although wastage at an element level is decreased, a variation among the photovoltaic elements remains to reflect a variation among photovoltaic element modules produced.

In the case of producing a number of photovoltaic element modules in such a way as above described, the resulting photovoltaic element modules are varied in terms of characteristics to a relatively large extent. For instance, in the case of producing a plurality of photovoltaic element modules by electrically connecting only the photovoltaic elements having inferior properties and attributes, the resulting photovoltaic element modules are liable to have an output value which is lower than the prescribed output value. This situation results in a decrease in the yield.

Further, there is an occasion of causing a problem in view of design. Particularly, the color tone of a photovoltaic element is based on interference colors of its constituent layers, i.e., the transparent electrode layer, reflection preventive layer, semiconductor photoactive layer, back reflecting layer, and the like. It can be said that when given photovoltaic elements are varied with respect to their constituent layers' thickness, they have a different color tone. And when a plurality of photovoltaic element modules are produced by using these photovoltaic elements, not only their insides are different from each other but also their color tones are different from each other. For solar cell modules produced by resin-sealing these photovoltaic element modules, as a matter of course, have a different color tone.

By the way, for building materials used for forming a roof or wall, they are required to have the same color tone in view of design. For roofing steel members, in general, they are required to have a chrominance which is within $\Delta E=1$. In the case of an ordinary building material whose color tone is decided depending upon the kind of a varnish used, it is possible to diminish the extent to which its appearance is mottled in accordance with a manner of coating a varnish or by using a proper varnish. But in the case of a solar cell module, it is not appropriate for its light receiving face side to be colored because of leading to decreasing the photoelectric conversion efficiency.

Now, Japanese Unexamined Patent Publication No. 217446/1997 discloses a wall face structure of a building in which even when panel members are different from each other in terms of finishing such as coloring, a wall face formed by connecting these panel members is free of a mottled appearance. Particularly, in the wall face structure described in this document, the panel members are curved, and they are connected through their side edges in the longitudinal direction so that rays irradiated are irregularly reflected by the respective panel members to avoid a mottled appearance.

However, according to the structure described in the above document, it is required for building materials to be curved. Therefore, it is necessary for the photovoltaic elements used in a solar cell module to be also curved. In this case, it is difficult to ensure the reliability of the solar cell module. And in the case of a photovoltaic element comprising a crystalline silicon material or a solar cell module having a glass plate on the outermost surface on the light receiving face side, it is difficult for them to be processed into a curved form.

SUMMARY OF THE INVENTION

The present invention is to solve the foregoing problems in the prior art and to attain objects of the present invention as will be described in the following (i) to (iii).

(i) The variation among the photovoltaic element modules with respect to their properties and attributes in the prior art is diminished to attain an improvement in the yield.

(ii) The variation among solar cell modules with respect to their color tone in the prior art is diminished to attain a building material integral type solar cell module having a satisfactory exterior appearance.

(iii) The problems in the prior art, i.e., the problems relating to the extra period of time and expenses incurred due to the requirement of making all the photovoltaic elements used in a solar cell module array have a complete property, the problems relating to the period of time and expenses incurred due to the treatment of excluding the photovoltaic elements having different properties, and the problems of causing an increase in the production cost of the solar cell modules as a whole respectively are solved.

A further object of the present invention is to provide a process for producing a solar cell module comprising at least a photovoltaic element module, said process having a step of forming said photovoltaic element module by electrically connecting a plurality of photovoltaic elements with each other, wherein prior to the step of forming said photovoltaic element module, said photovoltaic elements used for forming said photovoltaic element module are identified or classified into a plurality of groups which are different from each other in property and attribute, and said photovoltaic element module is made such that at least two kinds of photovoltaic elements having different property and attribute co-exist therein.

A further object of the present invention is to provide a solar cell module in which at least two kinds of photovoltaic elements capable of being distinguished or sorted one from the other in accordance their property and attribute co-exist.

According to the present invention, such advantages as will be described below are provided.

(1) In the process for producing a solar cell module comprising a plurality of photovoltaic element modules, having a step of forming each of said plurality of photovoltaic element modules by electrically connecting a plurality of photovoltaic elements with each other, prior to the step of forming said photovoltaic element module, by identifying or classifying said photovoltaic elements used for forming said plurality of photovoltaic element modules into a plurality of groups which are different from each other in property and attribute, and making each photovoltaic element module such that at least two kinds of photovoltaic elements having different property and attribute co-exist therein, there are provided such advantages as will be described below.

That is, the photovoltaic element modules are made such that their variation in terms of property and attribute is diminished. As a result, the yield is improved. Particularly, by identifying or classifying the photovoltaic elements into a plurality of groups which are different from each other in property and attribute, and making each photovoltaic element module such that at least two kinds of photovoltaic elements having different property and attribute co-exist therein, the variation among the photovoltaic element modules is diminished to improve the yield.

(2) Because the photovoltaic elements have properties in a limited distribution range due to the variation in their production process, the photovoltaic elements can be readily identified or classified. Particularly, because the distribution for the properties and attributes of the photovoltaic elements can be clarified, the central value of the distribution can be distinguished. As a result, the photovoltaic elements can be surely and readily identified or classified.

(3) By conducting the above identification or classification in terms of property and attribute in accordance with the short-circuit current values of the photovoltaic elements, the variation among the photovoltaic element modules in terms of short-circuit current value can be diminished.

(4) By conducting the above identification or classification in terms of property and attribute in accordance with the open-circuit voltage values of the photovoltaic elements, the variation among the photovoltaic element modules in terms of open-circuit voltage value can be diminished.

(5) By conducting the above identification or classification in terms of property and attribute in accordance with the maximum output voltage values of the photovoltaic elements, the variation among the photovoltaic element modules in terms of maximum output voltage value can be diminished.

(6) By conducting the above identification or classification in terms of property and attribute in accordance with the shunt resistance values of the photovoltaic elements, the variation among the photovoltaic element modules in terms of shunt resistance value can be diminished.

(7) In the above (6), instead of the shunt resistance value, by using an open-circuit voltage value when the intensity of incident light is less than 5 mW/cm$^3$, the measurement can be readily conducted using a proper measuring instrument which is simpler than that of measuring a shunt resistance. Because of this, the identification or classification can be easily conducted.

(8) By conducting the above identification or classification in terms of property and attribute in accordance with the series resistance values of the photovoltaic elements, the variation among the photovoltaic element modules in terms of series resistance value can be diminished.

(9) By conducting the above identification or classification in terms of property and attribute in accordance with the fill factor (F.F.) values of the photovoltaic elements, the variation among the photovoltaic element modules in terms of fill factor value can be diminished.

(10) By conducting the above identification or classification in terms of property and attribute in accordance with the light reflection spectral distributions of the photovoltaic elements, the variation among the photovoltaic element modules in terms of exterior appearance value can be diminished.

(11) By conducting the identification or classification based on the light reflection spectral distribution in the above (10) in accordance with the color tones of the photovoltaic elements, the variation in color tone with respect to solar cell module can be diminished, and as a result, the solar cell module can be made to have excellent design.

(12) Each of the foregoing photovoltaic elements has a transparent electrode layer on its light receiving face side. The above identification or classification of the photovoltaic elements is conducted on the basis of the thickness of their transparent electrode layer. Here, the transparent electrode layer serves as an upper electrode. Besides, the transparent electrode layer functions to increase irregular reflection of incident light and reflected light, where the optical path is prolonged, resulting in an increase in the photoelectric conversion efficiency.

In this connection, by conducting the identification or classification of the photovoltaic elements on the basis of the thickness of their transparent electrode layer as above described, the variation among the photovoltaic element modules in terms of electric characteristics and also in terms of color tone can be diminished.

(13) In the case where each of the foregoing photovoltaic elements has a reflection preventive layer on its light receiving face side, the above identification or classification of the photovoltaic elements is conducted on the basis of the thickness of their reflection preventive layer. Here, the reflection preventive layer functions to diminish light reflection on the surface of the solar cell module and prevent the light impinging inside from escaping to the outside, resulting in an increase in the photoelectric conversion efficiency.

In this connection, by conducting the identification or classification of the photovoltaic elements on the basis of the thickness of their reflection preventive layer as above described, the variation among the photovoltaic element modules in terms of electric characteristics and also in terms of color tone can be diminished.

(14) Each of the foregoing photovoltaic elements has a semiconductor photoactive layer on its light receiving face side. By conducting the above identification or classification of the photovoltaic elements on the basis of the thickness of their semiconductor photoactive layer, variation among the photovoltaic element modules in terms of electric characteristics and also in terms of color tone can be diminished as well as in the case of the above (12) or (13).

(15) Each of the foregoing photovoltaic elements has a back reflecting layer under the semiconductor photoactive layer. The above identification or classification of the photovoltaic elements is conducted on the basis of the thickness of their back reflecting layer. Here, the back reflecting layer functions to reflect the light reaching the substrate into the semiconductor photoactive layer where it is reused, resulting in an increase in the photoelectric conversion efficiency.

In this connection, by conducting the identification or classification of the photovoltaic elements on the basis of the thickness of their back reflecting layer as above described, the variation among the photovoltaic element modules in terms of electric characteristics and also in terms of color tone can be diminished.

(16) In the case where the process of forming the foregoing photovoltaic elements is of a continuous treatment system, adverse effect of residual impurities does not substantially occur upon the film formation, and because of this, photovoltaic elements having a high performance can be mass-produced with good reproducibility as the foregoing photovoltaic elements.

(17) When the continuous treatment system in the above (16) is a roll-to-roll system capable of forming a photovoltaic element on a long substrate, film formation can be continuously conducted. In this case, an improvement in the production speed can be attained and a reduction in the production cost can be also attained. This situation enables one to produce a solar cell module with a reasonable cost.

(18) In the case where the process of forming the foregoing photovoltaic elements is of a batch treatment system, desirable photovoltaic elements can be formed by a simple apparatus as the foregoing photovoltaic elements.

(19) When the foregoing photovoltaic elements are those prepared in a manner of dividing a long photovoltaic element-bearing substrate, which has been formed by a roll-to-roll film-forming process, along its center line in the transportation direction to obtain a plurality of photovoltaic elements having an equal size, the resulting solar cell module comes to have a narrow cover width. Therefore, when the solar cell module is made to be a roofing member integral type solar cell module, it can be used as a laterally roofing member with a narrow cover width and having good exterior appearance.

(20) When each of the photovoltaic elements in the above (19) are identified or classified in accordance with the position where the photovoltaic element has been formed in the roll-to-roll film-forming process, a particular measuring instrument or a particular measuring step is not necessary to be used and therefore, an improvement in the productivity can be attained.

(21) When the foregoing photovoltaic elements are photovoltaic elements produced in a plurality of photovoltaic element-forming apparatus capable of concurrently conducting the same treatment, by conducting the identification or classification of these photovoltaic elements in terms of property and attribute depending on photovoltaic element-forming apparatus, an improvement in the productivity can be attained.

(22) In the process of producing the foregoing photovoltaic element modules, by making the photovoltaic element modules such that different photovoltaic elements co-exist in each of them so that all the photovoltaic element modules have a uniform property, the advantage in the above (1) is more improved, and the yield is also more improved.

(23) In the process of producing the foregoing photovoltaic element modules, by making the photovoltaic element modules such that two kinds of photovoltaic elements having different property and attribute co-exist in a half-and-half proportion in each of them, the advantages in the above (1) and (22) are more improved.

(24) In the process of producing the foregoing photovoltaic element modules, by making the photovoltaic elements having different property and attribute co-existing in each of the photovoltaic element modules such that all adjacent photovoltaic elements are different from each other in terms of property and attribute, the variation in the inside color tone of each photovoltaic element module and the variation among the photovoltaic element modules with respect to their color tone can be overshadowed.

Even when the photovoltaic elements have a chrominance which is greater than $\Delta E=1$, by making them not to be neighbored with each other, the variation due to using them in terms of color tone is overshadowed, where the solar cell module comes to have satisfactory design.

(25) When the solar cell module is made such that the photovoltaic element modules are sealed by a sealing resin and a reinforcing member is laminated on the non-light receiving face side, the solar cell module is prevented from suffering from warping and the like and is satisfactory in rigidity. Therefore, the solar cell module can be desirably used as a building material.

(26) In the above (25), when the solar cell module is made to be a building material integral type solar cell module, being different from a conventional solar cell module of the type installed on a building material, it can be installed without using such building material. Because of this, the solar cell module is of a reasonable cost.

(27) Further, when the above solar cell module is used as a wall or roof, the solar cell module is effectively used, and power generation can be efficiently conducted.

BRIEF DESCRIPTION OF THE DRAWINGS

FIG. 6 is a schematic exploded view illustrating the constitution of an example of a photovoltaic element module in the present invention.

FIG. 10 is a schematic view showing an example of a photovoltaic element module before it is cut and an example of a photovoltaic element module cut from said photovoltaic element module in the present invention.

FIG. 12 is a schematic view illustrating an example of a characteristic-measuring device.

FIG. 13 is a schematic view illustrating an example of a solar cell module string or a solar cell module array in the present invention.

DETAILED DESCRIPTION OF THE INVENTION AND PREFERRED EMBODIMENTS

Figure 1:
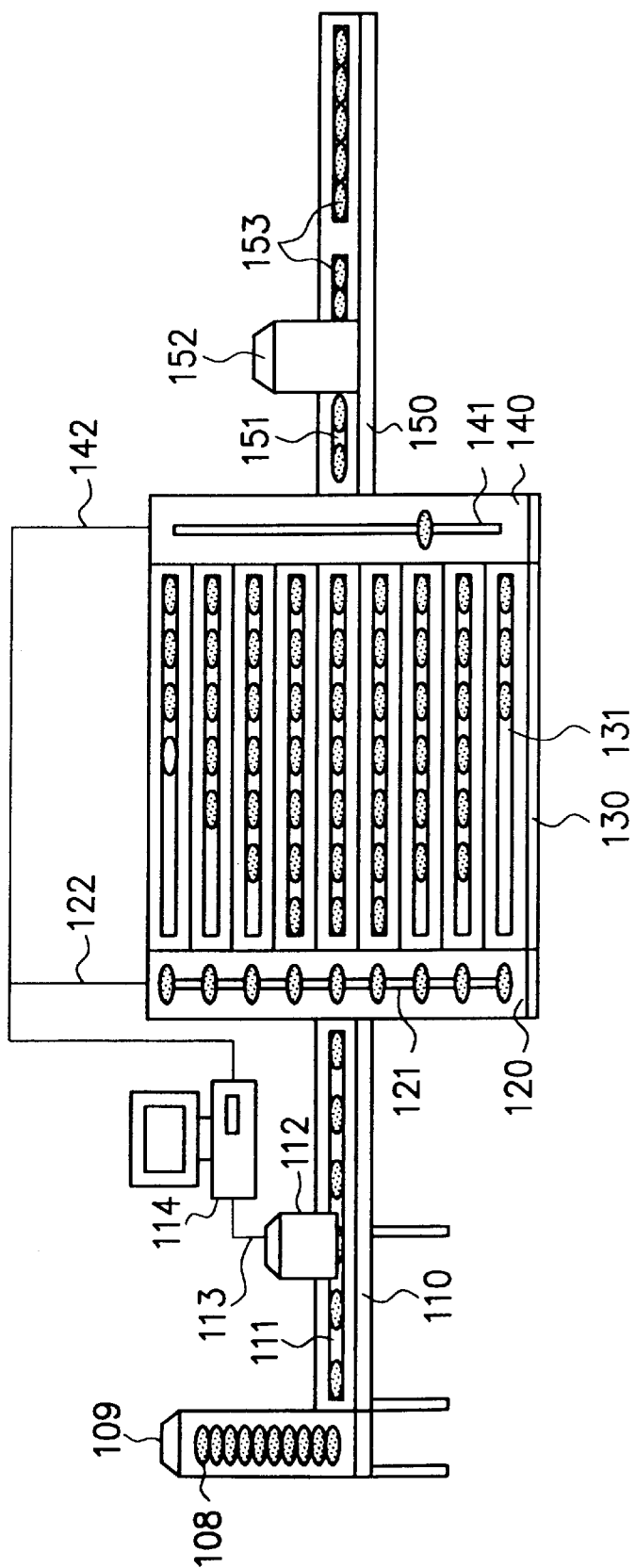
FIG. 1 is a schematic view illustrating the constitution of an example of an apparatus system suitable for producing a photovoltaic element module or a solar cell module in the present invention.

The present invention is to solve the foregoing problems found in the prior art and to attain the above described objects.

As previously described, a principal feature of the present invention is that in the production of a solar cell module which comprises a plurality of photovoltaic element modules each comprising a plurality of photovoltaic elements electrically connected with each other, a number of photovoltaic elements for forming said plurality of photovoltaic elements are provided, these photovoltaic elements are classified (or identified) in accordance with their property and attribute, and of the photovoltaic elements thus classified, a prescribed number of the photovoltaic elements which are different in terms of property and attribute are made to co-exist in each photovoltaic element module, whereby a variation among the photovoltaic element modules in terms of property and attribute is diminished.

The manner of classifying the photovoltaic elements as above described can include (a) a manner of classifying them in accordance with their electric characteristics, (b) a manner of classifying them in accordance with their color tone, (c) a manner of classifying them in accordance with their constituent layer's thickness, and (d) a manner of classifying them in accordance with their position on the substrate.

In the classification manner (a), the electric characteristics can include photoelectric conversion efficiency (Eff), short-circuit current value (Isc), open-circuit voltage value (Voc), maximum output voltage value (Pmax), shunt resistance value (Rsh), and series resistance value (Rs). Here, in the case where the illuminance of light irradiated to a photovoltaic element is low, the shunt resistance value (Rsh) of the photovoltaic element is small, and as the illuminance of the light is decreased, the open-circuit voltage value (Voc) is greatly decreased. In this connection, when the illuminance of light irradiated is low, instead of the shunt resistance value (Rsh), it is possible to use an open-circuit voltage value (L.L. Voc) at the time of less than 5 mW/cm$_2$.

The characteristics of a solar module according to the present invention can be estimated in accordance with a method of synthesizing I–V characteristic curves (the I–V characteristic curve will be occasionally simply referred to as "I–V curve" in the following) to obtain a synthesized I–V characteristic curve (this method will be hereinafter referred to as "I–V characteristic curve synthesis method") [see, measurement and Control, vol. 35, No. 5, published May, 1996, "measurement and evaluation"].

The I–V characteristic curve synthesis method is based on a presumption that the I–V curve of a photovoltaic element module is equal to an I–V curve obtained by combining the I–V curves of the respective photovoltaic elements constituting the photovoltaic element module.

Here, since the I–V characteristic curve synthesis method itself is a conventional technique, detailed explanation thereof is not conducted.

For a result obtained in accordance with the I–V characteristic curve synthesis method, as long as due care is made about the difference between the cable loss in the measurement of the characteristics of the respective photovoltaic elements and the cable loss in the measurement of the characteristics of the photovoltaic element module, it can be said that the result is correct in view of the principle of the I–V characteristic curve synthesis method.

Since the I–V curve of a given photovoltaic element module can be obtained by the I–V characteristic curve synthesis method, it is possible to find out a Pmax point from the I–V curve of the photovoltaic element module. Hence, it is possible to obtain an output power, Vpm (Pmax point voltage) and Ipm (Pmax point electric current) of the photovoltaic element module.

In the following, while referring to FIG. 1, description will be made of the process of forming a photovoltaic element module in the present invention, in which in accordance with the foregoing I–V characteristic curve synthesis method, each of the photovoltaic elements provided is measured with respect to the characteristics thereof and for a photovoltaic element module which will be formed by using some of these photovoltaic elements, the characteristics of the photovoltaic element module are estimated based on the measured results; and a plurality of photovoltaic element modules are formed by selectively using the photovoltaic elements so that no variation is caused among the photovoltaic element modules with respect to their characteristics.

FIG. 1 is a schematic view illustrating the constitution of an example of an apparatus system suitable for forming a photovoltaic element module. Particularly, the apparatus system shown in FIG. 1 is suitable for practicing the process of forming a solar cell module according to the present invention.

The apparatus system shown in FIG. 1 comprises an element supply zone of supplying photovoltaic elements previously formed into the apparatus system, a measurement zone of measuring the characteristics of the photovoltaic elements introduced, a stocking zone of separately stocking the photovoltaic elements depending on their characteristics, a module-forming zone of forming a photovoltaic element module by selectively taking up desired photovoltaic elements from the stocking zone, and an exhaustion zone of exhausting a photovoltaic element module formed in the module-forming zone, which are arranged in this order from the left side in the figure.

Now, in FIG. 1, reference numeral 108 indicates a photovoltaic element, and reference numeral 109 indicates an element supply device for supplying the photovoltaic element 108. In general, the photovoltaic element 108 is loaded on a carriage after the formation thereof, followed by being carried, and the photovoltaic element on the carriage is transferred into the element supply device 109 (this is not shown in FIG. 1). In this case, it is possible to design the apparatus such that the carriage is mechanically connected to the element supply device 109 so as to function as a part of the element supply device 109.

The photovoltaic element 108 thus supplied is transferred onto a conveyer 111 on a characteristics-measuring station 110 by means of the element supply device 109.

The photovoltaic element is transported by the conveyer 111. On the way of being transported by the conveyer, the photovoltaic element passes through a characteristics-measuring device 112, where the photovoltaic element is measured with respect to its characteristics by the characteristics-measuring device 112.

The characteristics-measuring device 112 generally has a solar simulator prescribed in JIS or the like and an I–V characteristics-measuring circuit.

The characteristics' data measured by the characteristics-measuring device 112 is sent to a computer 114 having a memory system, where the data is memorized in the memory system of the computer.

After the measurement by the characteristics-measuring device 112, the photovoltaic element is further transported by the conveyer 111 to enter in a sorting station 120, where the photovoltaic element is transported to a prescribed position, which is determined in accordance with the characteristics of a given photovoltaic element, by a conveyer 121 in the sorting station 120 on the basis of an indication transmitted from the computer 114 through a cable 122. Then, the photovoltaic element on the conveyer 121 is transferred into a stocker 130, where it is stocked while being positioned on a corresponding conveyer 131. in the stocker 130.

In the stocker 130, there are provided a plurality of conveyers 131 each corresponding to one of the prescribed positions with respect to the conveyer 121 in the sorting station 120, respectively determined in accordance with the characteristics of a given photovoltaic element. Thus, each of the photovoltaic elements which are sorted depending on their characteristics in the sorting station 120 in the foregoing manner is positioned on the corresponding conveyer 131 and stocked in the stocker 130.

Reference numeral 140 indicates a selection station having a conveyer 141 therein. In the selection station 140, from the stocker's conveyers 131, a desired number of the photovoltaic elements are selected and transported to a next station (a module forming station) by means of the conveyer 141. The selection of the photovoltaic elements is conducted in accordance with a selecting indication transmitted from the computer 141 through a cable 142.

The computer 141 always functions to conduct calculation of a synthesized I–V characteristic curve on the basis of the I–V characteristics of the photovoltaic elements on the stocker's conveyers 131 which already have been memorized in the computer 141 and to find out an optimum combination of the photovoltaic elements so that a solar cell module, which will be formed later, is always constant in terms of characteristics. When an optimum combination of the photovoltaic elements is determined, the selection station is controlled through the cable 142 to take up necessary photovoltaic elements from the stocker's conveyers 131 by means of the conveyer 141.

The photovoltaic elements thus taken up by the conveyer 141 in the selection station 140 are transported into a module-forming station 150. The photovoltaic elements entered in the module-forming station 150 are conveyed to arrive at a module-forming apparatus 152 by means of a conveyer 151, where the photovoltaic elements are electrically connected with each other, and then packaged. By this, the formation of a photovoltaic element module 153 is completed. In this way, a plurality of photovoltaic element modules can be continuously formed. Here, it is possible that a solar cell module is completed by the packaging process in the module-forming apparatus 152.

Each photovoltaic element module formed in the above is loaded on a carriage (not shown) and transported to a nest step which is a lamination step. In the case of a solar cell module already applied with lamination, the solar cell is transported to a step of conducting measurement of characteristics for a complete module product.

All the solar cell modules formed using the photovoltaic element modules formed in the above are uniform in terms of output power and characteristics within a desired range. And all the solar cell modules have a Pmax point within a desired range, and therefore, it is not necessary to consider a desired combination of these solar cell modules in the preparation of a solar cell module string or a solar cell module array. It is possible to prepare a desired solar cell module string or a solar cell module array without any loss even when randomly using them. Therefore, in the case of installing a solar cell module array on a roof of a building to establish a domestic sunlight power generation system, the execution work can be efficiently conducted without necessity of sorting the solar cell modules in the arrangement of them on the roof.

In the following, description will be made of a more preferable example of the process for producing a solar cell module according to the present invention.

In the above described module-forming process, the photovoltaic elements are stocked by postioning each of them on one of the corresponding stocker's conveyers respectively provided depending on the characteristics of a given photovoltaic element, as above described.

However, in practice, in the work of classifying the photovoltaic elements in accordance with, their characteristics, when all the photovoltaic elements involved should be different from each other with respect to their characteristics, an unlimited number of stocker's conveyers are necessary to be provided.

In order to solve such problem and to make the number of the stocker's conveyers be a practical number, such method as will be described below is employed.

The photovoltaic elements involved are classified depending on their characteristics, for instance, into 2 to 7 kinds (that is, 2 to 7 ranges) or preferably 3 to 5 kinds (that is, 3 to 5 ranges) with respect to the value of Vpm and into 2 to 7 kinds or preferably 3 to 5 kinds with respect to the value of Ipm. And the stocker's conveyers in a number corresponding to the number thus set up are provided.

All the photovoltaic elements whose characteristics have been measured are stocked on the corresponding stocker's conveyers sorted in accordance with the foregoing classification. For the photovoltaic elements not belonging to any of the foregoing ranges are excluded from the production process.

As the photovoltaic element to be an object for the calculation of a synthesized I–V characteristic curve, the photovoltaic element positioned at a top position of each of the stocker's conveyers theoretically and preferentially specified as a calculation candidate, namely, the photovoltaic element situated on the module-forming station side is selected. For the photovoltaic elements thus selected, the synthesis of their I–V characteristic curves is conducted. When a combination of the photovoltaic elements exhibits characteristics corresponding to those of a desired photovoltaic element module, the photovoltaic elements corresponding to said combination are selected to form the photovoltaic element module. In the case where said combination does not exhibit characteristics corresponding to those of the desired photovoltaic element module, the photovoltaic elements on other stocker's conveyers are picked up and a synthesized characteristic curve of them is calculated.

In a form in which the above contents are simplified, description will be made in the following example.

As a module, there is considered a photovoltaic element module in which five photovoltaic elements are electrically connected in series connection. And here, description will be made while focusing on a voltage.

In the classification of the photovoltaic elements based on their Vpm values, for the Vpm values, there are determined a plurality of ranges V1 to V5 in the direction of from a small Vpm value to a large Vpm value. And the classification is conducted so that the range V3 contains an average value for the characteristics of the photovoltaic elements involved. In general, when the characteristics of the photovoltaic elements involved are normally distributed, the number of the photovoltaic elements classified in the V3 range is relatively large. As the Vpm value diverges from the V3 range, the number of the photovoltaic elements is decreased.

In the case where other stocker's conveyers than those classified in the V3 range are vacant, five of the photovoltaic elements in the V3 range are selected several times to obtain a plurality of groups each comprising the five photovoltaic elements. And the process of forming a photovoltaic element module is started from a step of conducting the calculation of a synthesized I–V characteristic curve, because it is possible to form a photovoltaic element module using these photovoltaic elements as they are.

In the case where other stocker's conveyers than those classified in the V3 range, for instance, the stocker's conveyers classified in the V2 range should have the photovoltaic elements thereon, one of the photovoltaic elements in the V2 range is selected and four of the photovoltaic elements in the V3 range are selected, followed by obtaining a synthesized I–V characteristic curve, and determination is conducted of whether or not this combination exhibits characteristics corresponding to those of a desired photovoltaic element module. When the characteristics exhibited by this combination correspond to the targeted characteristics in the prescribed precision range, these photovoltaic elements are transported and subjected to the formation of a photovoltaic element module. However, in this case, because one of the photovoltaic elements classified in the V2 range is contained, the probability for the characteristics of this combination to correspond to those of the desired photovoltaic element module is small. By making this situation to be one of the factors in the judgment, when a simple aggregative value of the Vpm values in this case is considered, it can be said that the probability is small because the simple aggregative value is small. Therefore, in this case, without using any of the photovoltaic elements on the stocker's conveyers in the V2 range, a photovoltaic element module is continuously formed by using only the photovoltaic elements on the stocker's conveyers in the V3 range. In the case where when a synthesized I–V characteristic curve is repeatedly obtained for a combination of one of the photovoltaic elements on the stocker's conveyers in the V2 range with four of those photovoltaic elements successively supplied on the stocker's conveyers in the V3 range, it is impossible for any of the combinations to exhibit the targeted module characteristics, and the photovoltaic elements on the stocker's conveyers in the V2 range always remain as they are.

At a certain stage, when some photovoltaic elements are supplied on the stocker's conveyers in the V4 range, one of the photovoltaic elements on the stocker's conveyers in the V4 range, one of the photovoltaic elements on the stocker's conveyers in the V2 range, and three of the photovoltaic elements on the stocker's conveyers in the V3 range are selected, and a synthesized I–V characteristic curve for this combination is obtained. In this case, the probability for this combination to exhibit characteristics corresponding to the targeted module characteristics is relatively large. The reason for this is that when consideration is conducted by taking a simple aggregative value of the Vpm values into account as well as in the above case, the Vpm value of the photovoltaic element in the V2 range which is relatively small and that of the photovoltaic element in the V4 range which is relatively large are negated by each other, where an average electric voltage is possibly obtained.

When a desirable combination of the photovoltaic elements which exhibit the targeted module characteristics is found out in such manner as above described, the photovoltaic elements corresponding to the combination are transported into the module-forming station, where they are subjected to the formation of a photovoltaic element module.

Similarly, for instance, when one of the photovoltaic elements on the stocker's conveyers in the V1 range, three of the photovoltaic elements on the stocker's conveyers in the V3 range, and one of the photovoltaic elements on the stocker's conveyers in the V5 range are combined or one of the photovoltaic elements on the stocker's conveyers in the V1 range, two of the photovoltaic elements on the stocker's conveyers in the V3 range and two of the photovoltaic elements on the stocker's conveyers in the V4 range are combined, an average electric voltage is possibly obtained in each case.

Because the photovoltaic elements having characteristics apparently departed from the average value are excluded from the production line and the characteristics of the photovoltaic elements involved are normally distributed, the probability for those photovoltaic elements to be absolutely incapable of providing a desirable combination with other appropriate photovoltaic elements is extremely small.

Besides, there is considered a case wherein only some tens of photovoltaic elements whose characteristics being not normally distributed are continuously supplied and which are classified in, for instance, the V1 range. In this case, all the photovoltaic elements which are capable of providing a desirable combination with the photovoltaic elements in the V1 range which satisfies the targeted module characteristics have been already used, where the stocker's conveyers other than those in the V1 range become vacant. In this case, it is impossible to attain the targeted module characteristics even by combining only the photovoltaic elements in the V1 range in any way. These photovoltaic elements are not exhausted from the stocker's conveyers in the V1 range. Accordingly, when only the photovoltaic elements belonging to the V1 range are further supplied, the stocker's conveyers in the V1 range are filled by the photovoltaic elements belonging to the V1 range, and because of this, any further photovoltaic elements cannot be stocked in the stocker. This situation makes it impossible to exhaust any photovoltaic element from the characteristics-measuring station 110, where the entire production line is eventually stopped. In this case, there is employed such a measure that the photovoltaic elements on the stocker's conveyers in the V1 range are transferred onto a carriage or the like (not shown) to prevent the production line from being stopped.

All the foregoing sequences are automatically conducted in accordance with appropriate logic previously programed in the computer 114.

In the above description, explanation has been made while focusing on the Vpm. However, also in the case of Ipm, it is possible to use a sequence of such a basic principle that the photovoltaic elements on the stocker's conveyers having an arithmetic average of their Ipm values closer to a targeted Ipm value are preferentially selected and they are subjected to calculation with respect to their Ipm values.

By the way, in the previous explanation, it has been described that the photovoltaic elements are classified in accordance with their Vpm values, a combination of the photovoltaic elements which is considered to provide a preferable simple aggregative value of their Vpm values is roughly predicted, and the synthesis of the I–V characteristic curves of the photovoltaic elements of the combination is conducted. This is based on the following fact.

That is, in order to obtain the characteristics of a photovoltaic element module prepared by electrically connecting a plurality of photovoltaic elements with each other in series connection, strictly speaking in this case, it is necessary to use a characteristic curve obtained as a result of synthesizing their I–V characteristic curves. However, even by using an arithmetic sum of the Vpm values of the photovoltaic elements, it is possible to estimate the Vpm of the photovoltaic element module.

This situation will be explained by illustrating the following three cases (1) to (3).

(1) A case wherein for all the photovoltaic elements which are subjected to the formation of a photovoltaic element module, their Ipm values are substantially the same but their Vpm values are different from each other.

(2) A case wherein for all the photovoltaic elements which are subjected to the formation of a photovoltaic element module, their Vpm values are substantially the same but their Ipm values are different from each other.

(3) A case which is intermediate between the case (1) and the case (2).

All possible cases belong to one of the three cases (1) to (3).

In the case of the case (1), since all the photovoltaic elements which are connected in series connection have substantially the same Ipm value, these photovoltaic elements after having been connected in series connection have substantially the same Ipm value which is the same as the Ipm in the former. In other words, since no loss due to non-conformance with respect to the Ipm value occurs, the Pmax of each of the photovoltaic elements and the simple arithmetic sum of their Vpm values come to be equal to a Pmax and Vpm obtained from their I–V characteristic curves.

In the case of the case (2), an influence due to non-conformance of the Pmax points of the photovoltaic elements is the greatest. However, as a result of detailed studies by the present inventors, there has been found a fact that when the difference among the Ipm values of the photovoltaic elements is about 5%, their Pmax, Vpm and Ipm are of a difference of about 1% in comparison with a simple arithmetic sum and a simple average in the case of using the I–V characteristic curve synthesis method.

Therefore, it is possible to estimate approximate Pmax, Vpm and Ipm of the photovoltaic element module by using only the simple arithmetic sum and simple average of the characteristics of the respective photovoltaic elements.

As above described, the case (3) is intermediate between the case (1) and the case (2). In this case, as well as in the case (2), it is possible to estimate approximate Pmax, Vpm and Ipm of the photovoltaic element module by using only the simple arithmetic sum and simple average of the characteristics of the respective photovoltaic elements. In more detail, in the case where a photovoltaic element of 9W and a photovoltaic element of 11W are connected in series connection, the average output power per one photovoltaic element comes to be low. This means that in terms of classification, a stocker's conveyer for 9W, a stocker's conveyer for low and a stocker's conveyer for 11W are provided. Strictly speaking, the simple arithmetic sum and simple average are not correct, and therefore, it is desirable to additionally synthesize I–V characteristic curves for a combination of photovoltaic elements selected using the above measure as a clue to obtain accurate characteristics.

In the above, explanation has been conducted while focusing on the voltage. The situation is similar also with respect to the electric current.

That is, for instance, for the photovoltaic elements involved, they are classified with respect to their Ipm values into I-1 to I-5 groups in the direction of from small Ipm toward large Ipm, followed by being stocked on the corresponding stocker's conveyers. Upon forming a photovoltaic element module, the process of forming said photovoltaic element module is started from a step of selecting desired photovoltaic elements from the photovoltaic elements stocked on the stocker's conveyers preferentially specified, followed by conducting the synthesis of a synthesized I–V characteristic curve of their I–V characteristic curves.

In the case of using the electric current, due care is necessary to be made about the following point. That is, as a clue in the selection, it is necessary to select a combination of the photovoltaic elements such that not a simple arithmetic sum of their Ipm values but a simple average of the Ipm values comes closer to a targeted Ipm. This situation is based on the initially set condition that one photovoltaic element module comprises five photovoltaic elements electrically connected with each other in series connection. When this condition is changed, the calculation manner eventually differs. For instance, in the case of forming a photoelectric element module prepared by electrically connecting five photovoltaic elements in parallel connection, the corresponding stocker's conveyers from which desired photovoltaic elements are to be selected are specified by using a simple average of the Vpm values for the voltage and a simple arithmetic sum of the Ipm values as a clue. In this case, the synthesis of a synthesized I–V characteristic curve for the selected photovoltaic elements is not always necessary to be conducted.

The concept in this case is as will be described below.

In the previously described method, even until the sequence prior to the synthesis of a synthesized I–V characteristic curve in which a combination of desirable photovoltaic elements is found out, as above described, there are selected several combinations of photovoltaic elements, for instance, a combination of one of the photovoltaic elements in the V4 range with one of the photovoltaic elements in the V2 range while using three of the photovoltaic elements in the V3 range, a combination of one of the photovoltaic elements in the V5 range with one of the photovoltaic elements in the V1 range while using three of the photovoltaic elements in the V3 range, and a combination of two of the photovoltaic elements in the V4 range with one of the photovoltaic elements in the V1 range while using two of the photovoltaic elements in the V3 range. In any of these combinations, a simple arithmetic sum of the Vpm values of the photovoltaic elements involved comes closer to an average value of the Vpm values. Therefore, in comparison with a case where no selection is conducted for the photovoltaic elements and from these photovoltaic elements, a desired number of them are randomly selected as a combination, the probability of adequately obtaining targeted module characteristics is higher.

This method is focused on how to select desired photovoltaic elements from the photovoltaic elements stocked on the stocker's conveyers without focusing on a difference among the I–V characteristic curves of the respective photovoltaic elements. For photovoltaic element modules prepared in accordance with this method, a variation among their characteristics is relatively larger than that of photovoltaic element modules prepared by properly combining the photovoltaic elements selected so that a variation is not caused among their module characteristics. However, the former photovoltaic element modules are sufficiently practical depending on an allowance of a variation for targeted photovoltaic element module characteristics. And it can be said that this method is more practical in view of the quantity of calculation required and that of data to be stored and in view of the ability to simplify the sequence upon the selection of desired photovoltaic elements.

In this method, it is preferred to also conduct the characteristic test as a photovoltaic element module as will be described later. The characteristic test is conducted for the following reason. That is, in this method, the formation of a photovoltaic element is conducted by selecting a combination of desired photovoltaic elements and therefore, the resulting photovoltaic element modules are complete with respect to their characteristics. However, this situation is not demonstrated. Therefore, their data are supplemented at a later step.

As a matter of course, the results of the characteristic test indicate that no distinct variation is present among the photovoltaic element modules with respect to their characteristics.

Incidentally, by accumulating the data of the results of the characteristic test which will be conducted later, it is confirmed that targeted characteristics are obtained for the resulting photovoltaic element modules. For photovoltaic element modules formed after this, there can be considered various procedures such that the characteristic test for them is omitted, sampling is conducted for them, and the like.

In the prior art, in the case of separately examining each of the photovoltaic elements with respect to its characteristics, since those having characteristics different to more than a fixed extent from an average characteristic of the entire photovoltaic elements cannot be subjected to the formation of a photovoltaic element module, they are discarded in many cases. On the other hand, in the case of forming a plurality of photovoltaic element modules without examining the characteristics of each of the photovoltaic elements, when the resulting photovoltaic element modules have characteristics different from the targeted characteristics, all of them are discarded, or in the case where it is possible for them to be recycled, they are disassembled, the combinations of their constituent photovoltaic elements are changed, and a plurality of photovoltaic element modules are formed again. In this, enormous expenses are required and waste occurs.

The present invention is free of such problems. Particularly, because given photovoltaic elements having characteristics different from average characteristics of the entirety of the photovoltaic elements involved can be subjected to the formation of a photovoltaic element module without discarding them as in the prior art. In addition, the resulting photovoltaic element modules are complete with respect to their characteristics, and therefore, none of them is discarded and there is no necessity for them to be disassembled and recombined with respect to their constituent photovoltaic elements. In this connection, the total period of time consumed in the production of a number of photovoltaic elements is greatly diminished to improve the line production efficiency and the photovoltaic elements involved can be effectively used. This situation enables one to mass-produce a desirable solar cell module at a reduced production cost.

For the photovoltaic element modules prepared in the present invention, if required, the characteristic test is conducted for them in a solar cell module unit. The characteristic test is conducted by way of one time measurement using a characteristic measurement apparatus having a light source capable of irradiating the entirety of a solar cell module. The result obtained in the characteristic test in the solar cell module unit is basically the same as that obtained on the basis of the foregoing I–V characteristic curve synthesis. In this connection, the characteristic test in the solar cell module unit is not always necessary to be conducted.

However, in the cell module formation to obtain a solar cell module, for instance, in the case of providing a surface covering member such as a cover sheet, a cover glass or the like on its light receiving face, when there is an apparent difference between the quantity of light reaching the cell itself before the surface covering member is provided and after it is provided, if required, it is preferred for the characteristic test in the solar cell module unit to be conducted for all the photovoltaic element modules involved or by way of sampling.

For solar cell modules prepared in this way, all the solar cell modules are complete with respect to their characteristics. Therefore, for solar cell module strings prepared by electrically connecting two or more of these solar cell modules in series connection, even when these solar cell module strings are compared with each other, they are complete with respect to their characteristics as long as the number of their constituent solar cell modules connected in series connection is the same. In this connection, also upon preparing a solar cell module array by electrically connecting these solar cell module strings with each other in parallel connection, it is not necessary to care about difference with respect to output power and also about a difference with respect to Pmax point respectively of the solar cell module strings involved. This situation enables one to diminish the labor required in the arrangement and design of the solar cell modules.

Now, as an example of the foregoing classification method in accordance with the color tone, there can be mentioned a method of conducting classification by way of measuring a light reflection spectral distribution at the surface of a photovoltaic element.

As an example of the foregoing classification method in accordance with the thickness of each layer, there can be mentioned a method of measuring the thickness of one or more of the constituent layers of a photovoltaic element, i.e., the transparent electrode layer, semiconductor photoactive layer, back reflecting layer, and reflection preventive layer. The characteristics of the photovoltaic element also greatly depend on the conditions of forming these layers. And the color tone of the photovoltaic element greatly depends on the thickness of each of these layers because each of these layers is of interference color. The classification by the layer thickness is closely related to the classification by the electric property and that by the color tone.

Figure 2:
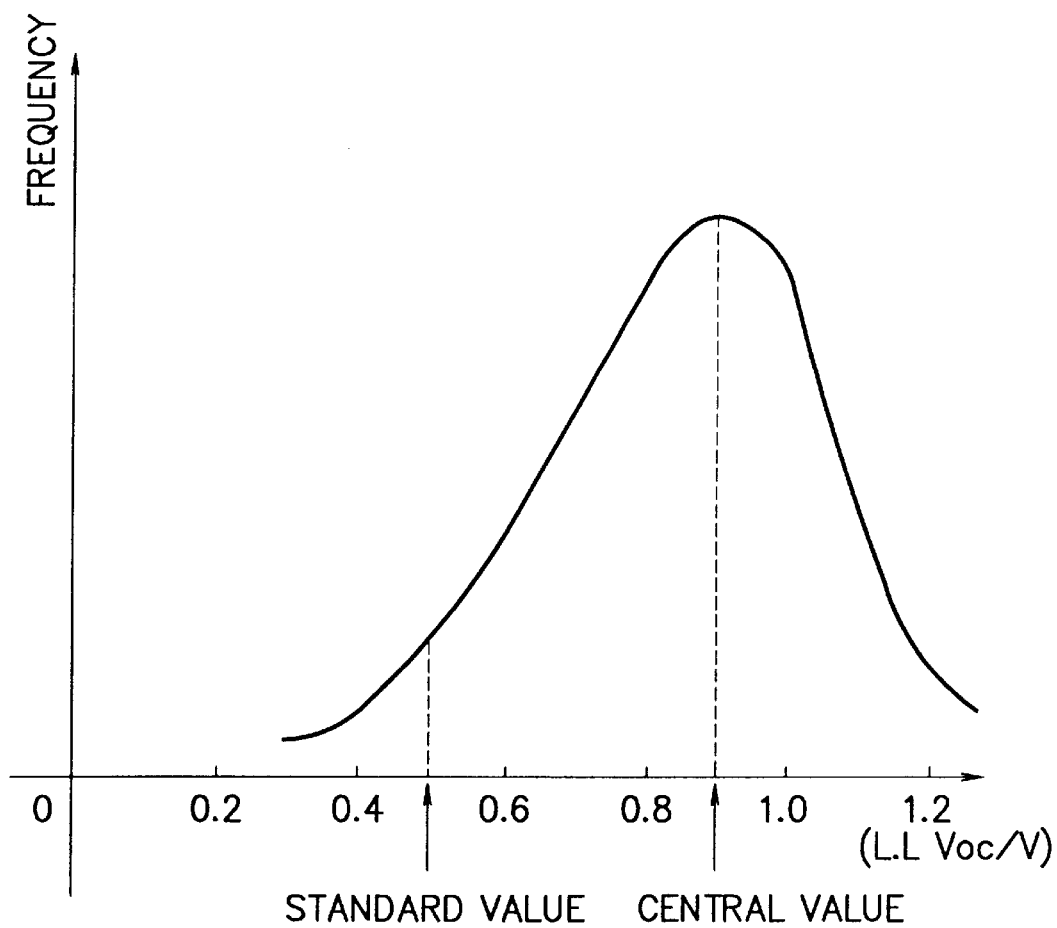
FIG. 2 shows a graph for explaining an example of a variation of a characteristic of a photovoltaic element.

In general, for given photovoltaic elements, when the factors with respect to property and attribute are measured for each of them, the measured results have a limited distribution range in any case. In FIG. 2, there is shown a graph illustrating an example of a distribution range of open-circuit voltage values (L.L. Voc) under irradiated light of 0.1 mW/cm². The classification in this case is conducted, for instance, in a manner wherein in the graph shown in FIG. 2, the photovoltaic elements in the range which is more than the central value of the normal distribution are classified as group A and those in the range which is more than the standard value but less than the central value are classified as group B.

Figure 3:
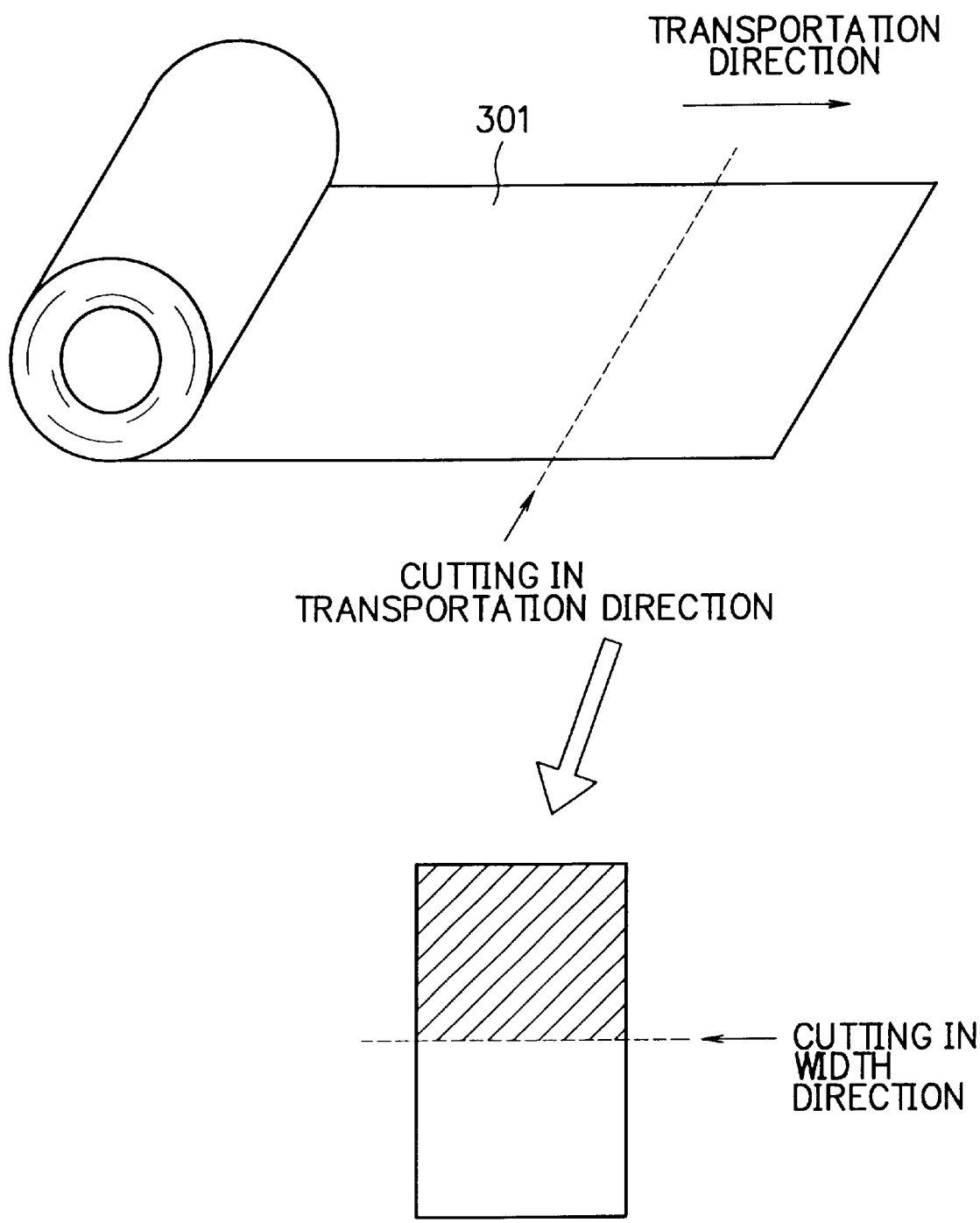
FIG. 3 is a schematic view for explaining an example for the direction of transporting a substrate and the direction of cutting said substrate.

As an example of the foregoing classification method in accordance with the position for each photovoltaic element, there can be mentioned a method of classifying photovoltaic elements in accordance with the position where each of them is cut or divided from a long substrate having a photovoltaic element formed thereon. Particularly, in the case of forming a photovoltaic element on a long substrate having a large area by conducting film formation by a film-forming process by way of a roll-to-roll system or the like, depending on the width direction of the long substrate (that is, the direction in parallel to the transportation direction), the film-forming condition is likely varied where a variation in terms of the film properties is liable to occur. In this connection, it is preferred that the long substrate is divided through its center in the width direction into parts and they are classified into, for instance, a right side photovoltaic element and a left side photovoltaic element to the transportation direction of the substrate in accordance with the divided position. The dividing direction in this case is shown in FIG. 3.

In more detail, for each of the two photovoltaic elements obtained by dividing the long substrate at a prescribed length in the transportation direction through the center in the width direction of the long substrate as above-described, a collecting electrode and a bus bar electrode are provided, followed by dividing the resultant in the width direction, whereby a number of photovoltaic elements are obtained. And the photovoltaic elements are classified depending on the position of the starting photovoltaic element before dividing in the width direction into two groups, i.e., a group A and a group B wherein the photovoltaic elements obtained on the right side belong to the group A and the photovoltaic elements obtained on the left side belong to the group B. In such classification method, it is absolutely not necessary to use a measuring instrument or a measuring process. Therefore, the classification method is very simple and appropriate.

In the case of preparing a plurality of photovoltaic element modules by electrically connecting these photovoltaic elements classified as above described in series connection in each case, by co-existing at least two kinds of the photovoltaic elements which are different in terms of property and attribute in each photovoltaic element, it is possible to prevent the resulting photovoltaic elements from having a variation with respect to their characteristics and also a variation with respect to their exterior appearances.

Figure 4:
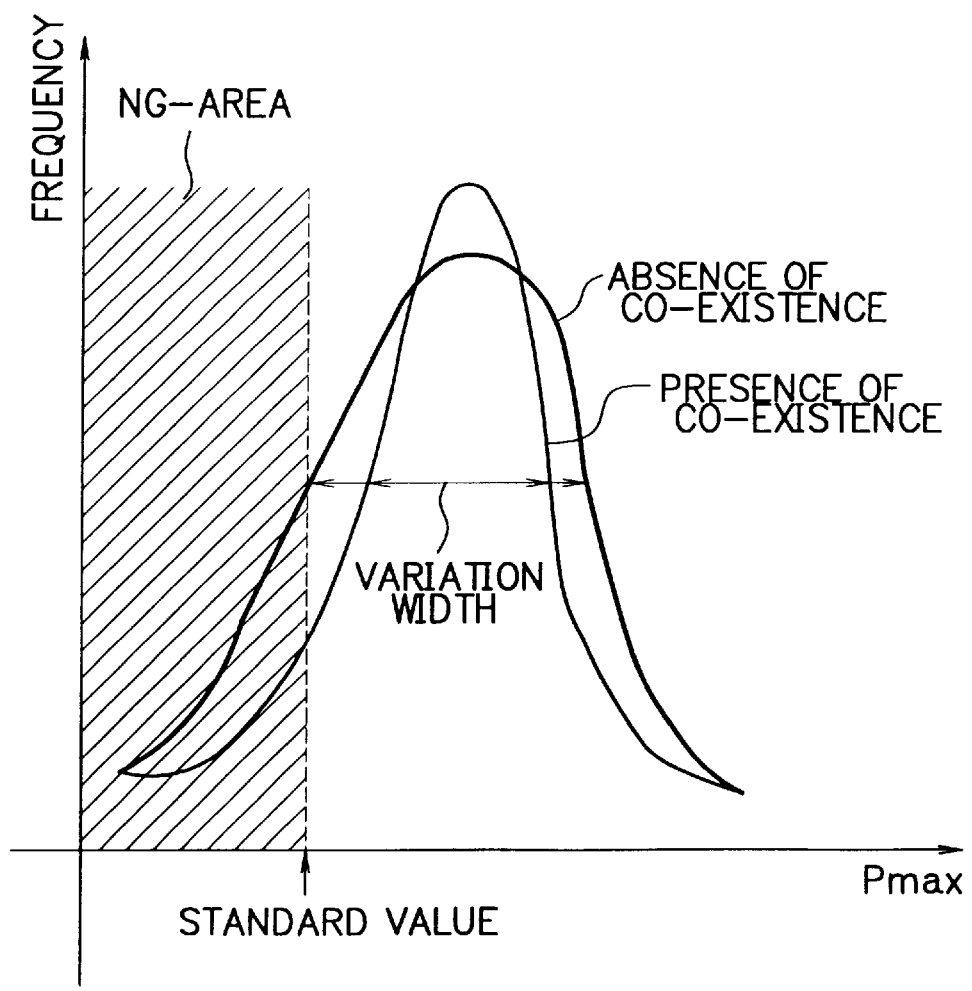
FIG. 4 shows a graph for explaining changes in a variation of a characteristic due to formation into a module.

FIG. 4 shows a graph illustrating a distribution range of maximum output power values (Pmax) of the photovoltaic elements in which the photovoltaic elements of the group A and those of the group B are made to co-exist. In FIG. 4, there is also shown a graph of a distribution range of Pmax of the photovoltaic elements with no such co-existence of the different photovoltaic elements as in the above. Based on the graphs shown in FIG. 4, there are understood such facts as will be described in the following. That is, by coexisting the photovoltaic elements which are different with respect to their characteristics, there is formed a photovoltaic element module by the photovoltaic elements having superior characteristics and those having inferior characteristics. In the case of forming a plurality of photovoltaic element modules, the properties of the resulting photovoltaic element modules are averaged such that a variation among their properties is apparently smaller in comparison than that among the properties of the photovoltaic elements with no such co-existence of the different photovoltaic elements, and the number of the photovoltaic elements whose properties being less than the standard is apparently small. Hence, the yield is improved.

In this method, it is possible to employ a manner of co-existing a plurality of photovoltaic elements which are different in terms of property and attribute in a half-and-half proportion and a manner of alternately co-existing said photovoltaic elements. Particularly, in the case of a photovoltaic element module in which a plurality of photovoltaic elements which are different in terms of property and attribute are alternately made to co-exist, if it should have a varied color tone, it is not noticeable. In the case of a solar cell module formed using a plurality of such photovoltaic element modules, when it is used as a building material for a roof or wall, it comes to be a building material excelling also in design performance. And when a plurality of such solar cell modules are installed over a large area, the above advantage becomes significant.

Photovoltaic Element and Photovoltaic Element Module

In the following, description will be made of examples of a photovoltaic element and a photovoltaic element in the present invention.

A photovoltaic element in the present invention typically comprises a back reflecting layer, a semiconductor photoactive layer, a transparent electrode layer and a collecting electrode stacked in this order on a substrate.

Figure 5A:
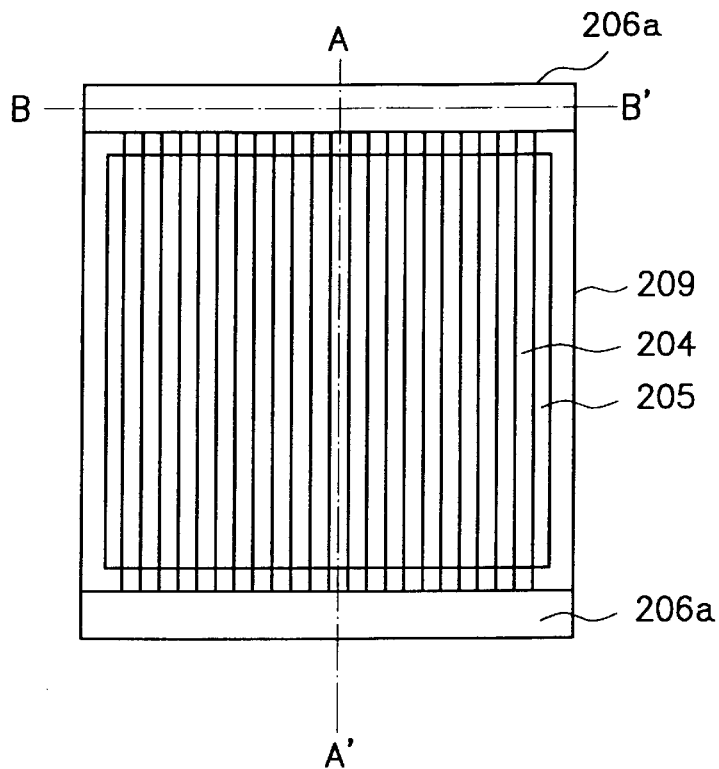
FIG. 5(A) is a schematic plan view illustrating an example of a photovoltaic element in the present invention.
Figure 5B:
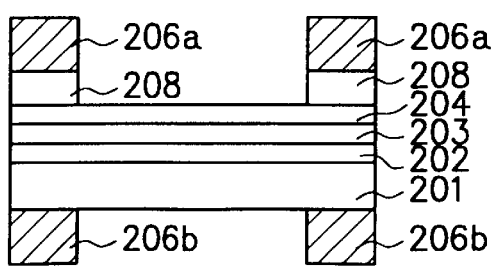
FIG. 5(B) is a schematic cross-sectional view, taken along the A–A' line in FIG. 5(A).
Figure 5C:
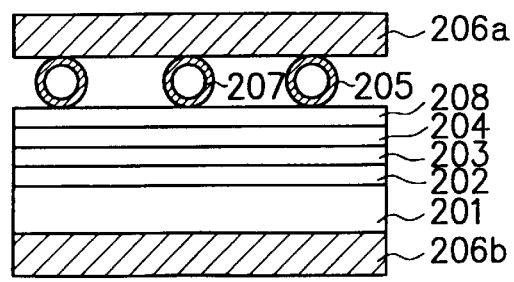
FIG. 5(C) is a schematic cross-sectional view, taken along the B–B' line in FIG. 5(A).

FIGS. 5(A) to 5(C) are schematic views illustrating an example of such photovoltaic element. FIG. 5(A) is a schematic plan view illustrating an example of said photovoltaic element, FIG. 5(B) is a schematic cross-sectional view, taken along the A–A' line in FIG. 5(A), and FIG. 5(C) is a schematic cross-sectional view, taken along the B–B' line in FIG. 5(A).

In FIGS. 5(A) to 5(C), reference numeral 201 indicates a substrate having flexibility, reference numeral 202 a back reflecting layer, reference numeral 203 a semiconductor photoactive layer, reference numeral 204 a transparent electrode layer, reference numeral 205 a collecting electrode, reference numeral 206a a bus bar electrode (for instance, as a positive electrode), and reference numeral 206b a bus bar electrode (for instance, as a negative electrode). Reference numeral 207 indicates an electrically conductive paste (such as an electrically conductive adhesive) or an electrically conductive coating layer which is coated on the collecting electrode 205, and reference numeral 208 an insulating layer.

In the following, description will be made of each constituent of the photovoltaic element.

Substrate 201

The substrate may be constituted by a material selected from the group consisting of metals, synthetic resins, glasses, ceramics, and semiconductor bulks.

The substrate may have an uneven surface provided with minute irregularities on which a photovoltaic element is to be formed.

It is possible to use a transparent substrate as the substrate 201 so that light is impinged from the substrate side.

Also in a viewpoint of making maximal use of the advantage of an amorphous silicon material having excellent flexibility, it is desired for the substrate to be constituted by a flexible material. Specific preferable examples of such flexible material are metals and synthetic resins. In the case of these metals and synthetic resins, a long substrate in a web form as the substrate 201 can be readily formed so as to comply with continuous film formation.

In the case where the substrate is constituted by a synthetic resin, such resin can include polyethylene terephthalate, polyethylene naphthalate, aromatic polyester, aromatic polyamide, polysulfone, polyimide, polyarylate, polyether, and ketone.

It is more preferred for the substrate 201 to comprise an electrically conductive substrate. In this case, the electrically conductive substrate serves not only as a substrate of a photovoltaic element but also as a lower electrode. For the electrically conductive substrate, there is no particular restriction as long as it has an electrically conductive surface. Specifically, it maybe an electrically conductive member composed of a metal such as Ta, Mo, W, Al, Cu, Ti, or the like or an electrically conductive member composed of an alloy such as stainless steel or the like. Besides, the electrically conductive substrate may comprise a carbon sheet or a Pb-plated steel sheet. Alternatively, the electrically conductive substrate may be a film or sheet made of a synthetic resin or a sheet made of a ceramic. In this case, the substrate is deposited with an electrically conductive film on the surface thereof.

Back Reflecting Layer 202

The back reflecting layer 202 disposed on the substrate 201 may comprise a metal layer, a metal oxide layer or a two layered structure comprising a metal layer and a metal oxide layer. These layers serve as a reflecting layer which reflects light reaching the substrate into a semiconductor layer positioned thereon so that it is reused therein. It is possible for these layers to be provided with irregularities at their surface. In this case, these layers serve to more effectively reflect the light reaching the substrate into the semiconductor layer, where the optical path in the semiconductor layer is prolonged to result in an increase in the short-circuit current.

The metal layer may be composed of a metal such as Ti, Cr, Mo, W, Al, Ag, Ni, Cu, Au or the like. The metal oxide layer may comprise an appropriate metal oxide such as $ZnO$, $TiO_2$, $SnO_3$, or the like.

Any of the foregoing metal layers and the oxide layers may be formed by a conventional film-forming technique such as resistant heating evaporation, electron beam evaporation, sputtering, plating, or screen printing.

Semiconductor Photoactive Layer 203

The semiconductor photoactive layer 203 functions to conduct photoelectric conversion. The semiconductor photoactive layer may comprise a non-single crystal silicon semiconductor material having a semiconductor junction such as a pn junction type polycrystalline silicon material, a pin junction type amorphous silicon material, or the like. Besides, it may comprise a compound semiconductor material having a semiconductor junction. Specific examples of such compound semiconductor material are $CuInSe_2$, GaAs, $CdS/Cu_2S$, CdS/CdTe, CdS/InP, $CdTe/Cu_2Te$, and the like.

In the case where the semiconductor photoactive layer is composed of a polycrystalline silicon semiconductor material, it may be formed by a conventional polycrystalline silicon film-forming manner of providing a fused silicon material and subjecting the fused silicon material to film-making processing or another conventional polycrystalline silicon film-forming manner of subjecting an amorphous silicon material to heat treatment. In the case where the semiconductor photoactive layer is composed of an amorphous silicon semiconductor material, it may be formed by a conventional plasma CVD process such as a microwave plasma CVD process or a high frequency plasma CVD process in which a proper film-forming raw material gas is capable of imparting silicon atoms representatively such as silane gas.

In the case where the semiconductor photoactive layer is composed of a compound semiconductor material, it may be formed by means of ion plating, ion beam deposition, vacuum evaporation, sputtering, or electro-deposition.

In the following, description will be made of an example of forming a semiconductor photoactive layer by means of the plasma CVD process.

In the case where a glass plate is used as the substrate, there is usually employed a batch treatment system. In the case where a long substrate is made of, for example, stainless steel, there can be employed a continuous treatment system.

Now, for instance, in the case of forming an amorphous silicon semiconductor layer, there can be employed a manner wherein raw material gases such as monosilane ($SiH_4$), and diborane ($B_2H_6$) or phosphine ($PH_3$) are introduced into a reaction chamber maintained at a vacuum degree of about 10 to about 103 Pa, followed by applying an RF power into the reaction chamber, thereby forming an amorphous silicon semiconductor film as the amorphous silicon semiconductor layer on a glass substrate or a stainless steel substrate.

The above-described batch treatment system is a system whose reaction chamber comprises a single chamber, in which film formation is conducted by given raw material gases introduced into the reaction chamber while being mixed. Although this system has an advantage in that the film-forming apparatus is simple, it has disadvantages such that foreign matter deposited and remaining on an inner wall face of the reaction chamber or on the surface of an electrode positioned in the reaction chamber upon repeating the film formation is liable to remove therefrom and contaminate a semiconductor film formed on a substrate and therefore, it is difficult to always stably form a photovoltaic element having good characteristics with good reproducibility.

The foregoing continuous treatment system means a multi-chambered system comprising a plurality of reaction chambers communicated with each other, each reaction chamber being exclusively used for each raw material gas, in which a substrate is continuously transported to pass through the reaction chambers while forming a film on the substrate in each reaction chamber. This system has advantages such that the influence of residual foreign matter is slight, a high quality semiconductor film can be continuously formed on the substrate, and therefore, a photovoltaic element having satisfactory characteristics can be continuously formed with good reproducibility; thus the system excels in productivity.

Transparent Electrode Layer 204

The transparent electrode layer 204 functions as an upper electrode for outputting a photoelectromotive force generated in the semiconductor photoactive layer, and it also functions to increase the quantity of incident light into the semiconductor photoactive layer while preventing the incident light from being reflected. Since the transparent electrode layer is positioned on the side through which light is impinged, it is required to be transparent. Particularly, in order for sunlight or rays from a white fluorescent lamp to be efficiently introduced into the semiconductor photoactive layer, the transparent electrode layer is desired to have a light transmittance of more than 85%. In addition, by making the transparent electrode layer have an appropriate electric resistance, it is possible to efficiently flow an electricity from the semiconductor photoactive layer and to prevent the semiconductor photoactive layer from suffering short circuit due to a defect such as a pinhole present therein. In view of this, it is desired for the transparent electrode layer to have a resistivity in the range of $10^{-5}$ (1/Ω cm) to $10^{-2}$ (1/Ω cm).

The transparent electrode layer may comprise $In_2O_3$, $SnO_2$, ITO ($In_2O_3$—$SnO_2$), ZnO, $TiO_2$, or $Cd_2SnO_4$. Besides, it may comprise a crystalline semiconductor layer doped with an appropriate impurity with a high concentration.

The transparent electrode layer constituted by any of the above mentioned materials may be formed by means of resistant heating evaporation, sputtering, spraying, or CVD. The above described impurity-doped crystalline semiconductor layer as the transparent electrode layer may be formed by a conventional impurity diffusion process.

By the way, it is generally known that the voltage generated by one photovoltaic element is less than several voltages. In this respect, for a photovoltaic element module, it is necessary to be formed by electrically connecting a plurality of photovoltaic elements with each other in series connection. In this connection, in the case of forming the foregoing layers on a long flexible substrate in a web form using the continuous treatment system to form a photovoltaic element on the long flexible substrate, it is necessary that the long flexible substrate having the photovoltaic element formed thereon is cut to obtain a plurality of photovoltaic elements having a fixed size, and these photovoltaic elements are electrically connected with each other in series connection into a photovoltaic element module. In this case, for the photovoltaic elements cut from the long flexible substrate, their size can be optionally changed depending on related factors such as the size of a desired photovoltaic element module, the magnitude of a voltage required for the photovoltaic element module. However, any of these photovoltaic elements cut as above described has a cut cross-section in which a part of the photovoltaic element is crushed such that the transparent electrode layer and the flexible substrate are short-circuited.

Incidentally, in the case of a thin film amorphous silicon photovoltaic element, since it is of a very thin film thickness, the semiconductor photoactive layer is liable to have several short-circuited defects therein. These short-circuited defects can be repaired by providing an element separation portion 209 at a periphery of the transparent electrode layer as shown in FIG. 5(A), thereby passivating the short-circuited defects present in the end periphery of the substrate. Particularly, this method is conducted, for instance, in the following manner. That is, a photovoltaic element having such short-circuited defects is firstly immersed in an 8 wt % aqueous solution of aluminum chloride hexahydrate, a counter electrode patterned to have a thickness which is smaller than that of the photovoltaic element by 1 mm and a width of 0.1 mm is positioned to oppose the photovoltaic element in the aqueous solution while having an interval of 1 mm to the transparent electrode layer of the photovoltaic element, and a direct current of 0.5 s and 25 A is applied by means of a sequence controller, thereby forming an element separation portion 209 at a periphery of the transparent electrode layer of the photovoltaic element. Then, the counter electrode is replaced by an electrode comprising a stainless steel plate whose size is the same as that of the photovoltaic element and it is positioned in the aqueous solution to oppose the photovoltaic element while having an interval of 4.0 mm between them, and a bias voltage of 4.5 V is applied by means of the sequence controller, whereby passivating portions of the transparent electrode layer which are situated in the short-circuited defects. After this, the photovoltaic element thus treated is subjected to washing with water, followed by subjecting it to drying. In this way, there is obtained a repaired photovoltaic element whose short-circuited defects have been passivated.

Collecting Electrode 205

On the transparent electrode layer of the photovoltaic element obtained in the above, the collecting electrode 205 in a grid form (or the grid electrode) may be provided in order to efficiently collect an electric current.

The collecting electrode may comprise a metal such as Ti, Cr, Mo, W, Al, Ag, Ni, Cu or Sn, or an alloy of these metals. Alternatively, the collecting electrode may be formed of an electrically conductive paste. The electrically conductive paste can include electrically conductive pastes comprising powdery Ag, Au, Cu, Ni or carbon dispersed in an appropriate binder resin. The binder resin herein can include polyester epoxy resin, acrylic resin, alkyd resin, polyvinyl acetate, rubber, urethane resin, and phenol resin.

The collecting electrode may be formed by means of sputtering using a mask pattern, resistant heating evaporation, or CVD. It may be also formed by a manner of depositing a metal film over the entire surface and subjecting the metal film to etching treatment to form a desired pattern, a manner of directly forming a grid electrode pattern by means of light-induced CVD, or a manner of forming a negative pattern corresponding to a grid electrode pattern and subjecting the resultant to plating treatment.

The formation of the collecting electrode using the above described electrically conductive paste may be conducted by subjecting the electrically conductive paste to screen printing.

For the resultant photovoltaic element having a desired size, a pair of a positive bus bar electrode 206a and a negative bus bar electrode 206b for outputting an electromotive force are provided, where the positive bus bar electrode 206a is fixed to the collecting electrode 205, and the negative bus bar electrode 206b is fixed to the substrate 201. Specifically, for instance, a metal body such as copper tub as the negative bus bar electrode 206b is joined to the substrate by way of spot welding or by soldering a brazing material such as solder, and an appropriate metal body as the positive bus bar electrode 206a is electrically connected to the collecting electrode by using an electrically conductive paste 207 or a brazing material.

Upon fixing the positive bus bar electrode 206a to the collecting electrode 205, in order to prevent the positive bus bar electrode from contacting with the substrate or the semiconductor photoactive layer, it is preferred to provide an insulating layer 208.

After the collecting electrode and the bus bar electrodes are provided, if necessary, the photovoltaic element may be divided into two photovoltaic elements. In this case, in order to prevent the transparent electrode layer from being short-circuited with the substrate, it is necessary to take a measure of previously removing a portion of the transparent electrode through which the photovoltaic element is to be divided, or a measure of previously providing an insulating member in order to prevent the collecting electrode from being short-circuited with the substrate.

In the way as above described, there are obtained a plurality of photovoltaic elements.

A photovoltaic element module is prepared by electrically connecting these photovoltaic elements with each other in series connection. These photovoltaic elements comprise those belonging to group A and those belonging to group B in terms of property and attribute. In this photovoltaic element module, the plurality of photovoltaic elements are arranged such that an arrangement in which one of the photovoltaic elements belonging to group A and one of the photovoltaic elements belonging to group B are alternately arranged is repeated several times.

Solar Cell Module

Description will be made of an example of a process for forming a practically usable solar cell module by sealing a photovoltaic element module prepared in the way as above described, using a sealing resin.

FIG. 6 is a schematic exploded view illustrating the constitution of an example of a solar cell module of the present invention in which such photovoltaic element module as above described is used.

In FIG. 6, reference numeral 401 indicates a photovoltaic element module, reference 402 a surface side protecting and reinforcing member, reference numeral 403 a surface side filler, reference numeral 404 a transparent surface protective member positioned at the outermost surface, reference numeral 405 a back side filler, reference numeral 406 a back side insulating member, and reference numeral 407 a back face reinforcing member.

In the case of the solar cell module shown in FIG. 6, external light is impinged from the transparent surface protective member 404, followed by reaching in the photovoltaic element module 401 wherein a power is generated, and the power is outputted to the outside through a power output portion (not shown).

In the following, description will be made of each of the foregoing covering materials used in the preparation of a solar cell module.

Surface Protective Member 403

The surface protective member is required to excel in transparency and weatherability. It is also required for the surface protective member to be minimally stained.

In the case of using a glass member as the surface protective member, there is a problem in that in order to achieve sufficient packing, the surface side filler is necessary to be thickened. In this case, there occurs another problem in that not only the weight of the solar cell module is increased but also the glass member as the surface protective member is likely to be broken due to external impact.

In this connection, it is desired to use a weathering and transparent film as the surface protective member. In this case, there are advantages such that not only improved packing but also lightening are achieved, and the surface protective member is hardly broken even when external impact is applied thereon. In addition, by conducting embossing treatment to the surface of the film as the surface protective film, there is provided an advantage in that glare protection can be attained for sunlight reflected at the surface of the surface protective member.

Preferable examples of such weathering and transparent film usable as the surface protective member are films made of fluororesin. Specific examples of such fluororesin are polyethylene-tetrafluoroethylene copolymer (ETFE), polytrifluoroethylene, polyvinyl fluoride, and the like. However, the weathering and transparent film usable as the surface protective member is not limited to these fluororesin films.

In order to attain an improved adhesion of the surface protective member with the surface side filler, the surface of the surface protective member to be contacted with the surface side filler is desired to be subjected to surface treatment such as corona charging treatment.

Surface Side Filler 403

The surface side filler is required to excel specifically in weatherability, thermoplasticity, thermal adhesion, and transparency. As the surface side filler, there is used a resin which satisfies these requirements. As such resin, there can be mentioned, for example, ethylene-vinyl acetate copolymer (EVA), ethylene-methyl acrylate copolymer (EMA), ethylene-ethyl acrylate copolymer (EEA), butyral resin, silicone resin, epoxy resin, and fluorinated polyimide resin. These are not limitative.

Of the above mentioned resins, EVA has well-balanced physical properties for use as a filler in a solar cell module. Hence, EVA is preferably used.

By adding a crosslinking agent and a crosslinking assisting agent to the surface side filler, the surface side filler can be desirably crosslinked. Further, in order to prevent the surface side filler from suffering from photo-deterioration, it is desired for the surface side filler to contain a UV absorber or photo-stabilizer.

Surface Side Protecting and Reinforcing Member 402

In the case of a solar cell module whose surface side is sealed by a surface side filler resin and a surface protective resin film, in order to sufficiently protect a photovoltaic element module present in the solar cell module from the outside using a small amount of the surface side filler resin, there is taken a measure of incorporating a surface side protecting and reinforcing member in the surface side filler resin.

As such surface side protecting and reinforcing member, there can be mentioned, for instance, fibrous inorganic materials such as non-woven glass fiber, woven glass fiber, and glass filler. Of these, the non-woven glass fiber is particularly appropriate in view of cost and performance. For the woven glass fiber, there are disadvantages such that it is costly and is difficult to impregnate with the resin. For the glass filler, it is less effective in a viewpoint of protecting from external environment and difficult to attain sufficient protection using a small amount thereof.

In any case, in order for the surface side protecting and reinforcing member to exhibit a sufficient adhesion upon continuous use over a long period of time, it is desired for the surface side protecting and reinforcing member to contain a silane coupling agent or an organic titanate.

Backside Filler 405

The backside filler 405 serves to ensure the adhesion between the photovoltaic element module 401 and the backside insulating member 406 and the adhesion between the backside insulating member 406 and the back face reinforcing member 407.

The backside filler is desired to comprise a material which excels in long durability, withstands thermal expansion and thermal contraction, and excels in flexibility. Specific examples of such material are hotmelt materials such as ethylene-vinyl acetate copolymer (EVA), ethylene-methyl acrylate copolymer (EMA), ethylene-ethyl acrylate copolymer (EEA), polyethylene, and polyvinyl butyral. Besides, double-coated tapes and epoxy adhesives having flexibility are also usable. In order for the backside filler to have an improved adhesion with the backside insulating member and the back face reinforcing member, it is possible to coat a stackifier resin on the surface thereof. Further, it is possible that the resin used as the backside filler is the same as that used as the surface side filler.

In order to simplify the process involved, it is possible for the opposite surfaces of the backside insulating member 406 to have an adhesive layer comprising the foregoing epoxy adhesive integrally stacked thereon.

Backside Insulating member 406

The backside insulating member is used for electrically isolating the substrate of the photovoltaic element module 401 from the outside. The backside insulating member comprises a material which is capable of ensuring sufficient electric insulation with the substrate of the photovoltaic element module and which excels in long durability, withstands thermal expansion and thermal contraction, and excels in flexibility. Specific examples of such material are a film made of nylon, a film made of polyethylene terephthalate, and a film made of polycarbonate.

It is possible to attain electric insulation for the substrate of the photovoltaic element module by the backside filler only. However, the thickness of the backside filler is likely varied, where in a portion of the backside filler which is thinned or which has a pinhole, there is a fear that a short occurs between a given photovoltaic element of the photovoltaic element module and the outside. The backside insulating member serves to prevent this problem from occurring.

Back Face Reinforcing Member 407

The back face reinforcing member is fixed to the outer face of the backside insulating member 406 in order to improve the mechanical strength of the solar cell module and to prevent the solar cell module from being distorted or warped due to a change in the environmental temperature and also in order to make the solar cell module be a roofing member integral type solar cell module.

As the back face reinforcing member, there can be used a zinc-coated steel plate coated by an organic polymer resin, a steel plate, a galvanized steel plate, a plated steel plate, a plastic plate, or a fiber-glass reinforced plastic plate (FRP plate).

In the following, the present invention will be described in more detail with reference to examples which are not intended to restrict the scope of the present invention.

EXAMPLE 1

In this example, using an amorphous silicon photovoltaic element module in which a plurality of photovoltaic elements which are different in terms of property and attribute are co-existed, a roofing member integral type amorphous silicon solar cell module was prepared.

Preparation of Photovoltaic Element

A plurality of amorphous silicon (a—Si) photovoltaic elements (solar cells) having the configuration shown in FIGS. 5(A) to 5(C) were prepared in the following manner.

That is, a coil of a well-cleaned stainless steel web substrate (hereinafter referred to as stainless steel substrate) having a width of 340 mm as the substrate 201 was installed in a conventional multichambered roll-to-roll film-forming system, and while transporting the stainless steel substrate to pass through respective chambers in the film-forming system, film formation was continuously conducted as will be described below.

First, as the back reflecting layer 201, there were sequentially formed a 5000 Å thick Al film and a 5000 Å thick ZnO film on the stainless steel substrate 201 by a conventional sputtering process. Then, on the back reflecting layer 202, in accordance with a conventional plasma CVD process, there was formed a tandem type a—Si photoelectric conversion semiconductor layer as the semiconductor photoactive layer 203 comprising a 150 Å thick n-type a—Si layer/a 4000 Å thick i-type a—Si layer/a 100 Å thick p-type microcrystalline silicon (pc-Si) layer/a 100 Å thick n-type a—Si layer/a 800 Å thick i-type a—Si layer/a 100 Å thick p-type pc-Si layer being laminated in this order from the substrate side, where each n-type a—Si layer was formed from a mixture of $SiH_4$, $PH_3$, and $H_2$; each i-type a—Si layer was formed from a mixture of $SiH_4$ and $H_2$; and each p-type μc-Si layer was formed from a mixture of $SiH_4$ $_{BF3}$, and $H_2$. Successively, on the semiconductor photoactive layer 203 comprising the tandem type a—Si photoelectric conversion semiconductor layer, there was formed a 700 Å thick $In_2O_3$, film as the transparent electrode layer 204 by a conventional heat resistance evaporation process wherein an In source was evaporated in an $O_2$ atmosphere.

The stainless steel substrate 201 having the back reflecting layer 202, the semiconductor photoactive layer 203 and the transparent electrode layer 204 stacked in this order thereon was cut to obtain a plurality of photovoltaic elements of 340 mm in width and 240 mm in length.

Each of these photovoltaic elements was treated as will be described below.

That is, each photovoltaic element was immersed in an 8 wt. % aqueous solution of aluminum chloride hexahydrate. A counter electrode patterned to have a thickness which is smaller than that of the photovoltaic element by 1 mm and a width of 0.1 mm was positioned to oppose the photovoltaic element in the aqueous solution while having an interval of 1 mm to the transparent electrode layer of the photovoltaic element, and a direct current of 0.5 s and 25 A was applied by means of a sequence controller, thereby forming an element separation portion 209 at a periphery of the transparent electrode layer of the photovoltaic element. Then, the counter electrode was replaced by an electrode comprising a stainless steel plate whose size was the same as that of the photovoltaic element and it was positioned in the aqueous solution to oppose the photovoltaic element while having an interval of 4.0 mm between them, and a bias voltage of 4.5 V was applied by means of the sequence controller, whereby passivating portions of the transparent electrode layer are situated in the short-circuited defects caused upon the film formation. After this, the photovoltaic element thus treated was subjected to washing with water, followed by subjecting it to drying. In this way, there was obtained a repaired photovoltaic element whose short-circuited defects had been passivated.

On the transparent electrode of the resultant photovoltaic element, there was formed a collecting electrode 205 (a grid electrode). Then, a copper tub as the negative bus bar electrode 206b was fixed to the stainless steel substrate 201 using a solder and a tin foil tape as the positive bus bar electrode 206a was fixed to the collecting electrode using a solder, thereby making the photovoltaic element have a pair of power output terminals.

In this way, there were prepared a plurality of complete photovoltaic elements.

Classification of Photovoltaic Element

As for each of the photovoltaic elements obtained in the above, its open-circuit voltage value (L.L.Voc) under the irradiation of light with an incident intensity of 0.1 $mW/cm^2$ (about 200 Lx) was measured. Of the photovoltaic elements whose open-circuit voltage value had been measured, those having an open-circuit voltage value of less than 0.5 V were excluded as being outside the standard. For the remaining photovoltaic elements, those having an open-circuit voltage value in the range of 0.5 V to 0.9 V were classified into group B, and those having an open circuit voltage value of beyond 0.9 V were classified into group A.

Preparation of Photovoltaic Element Module

Figure 7A:
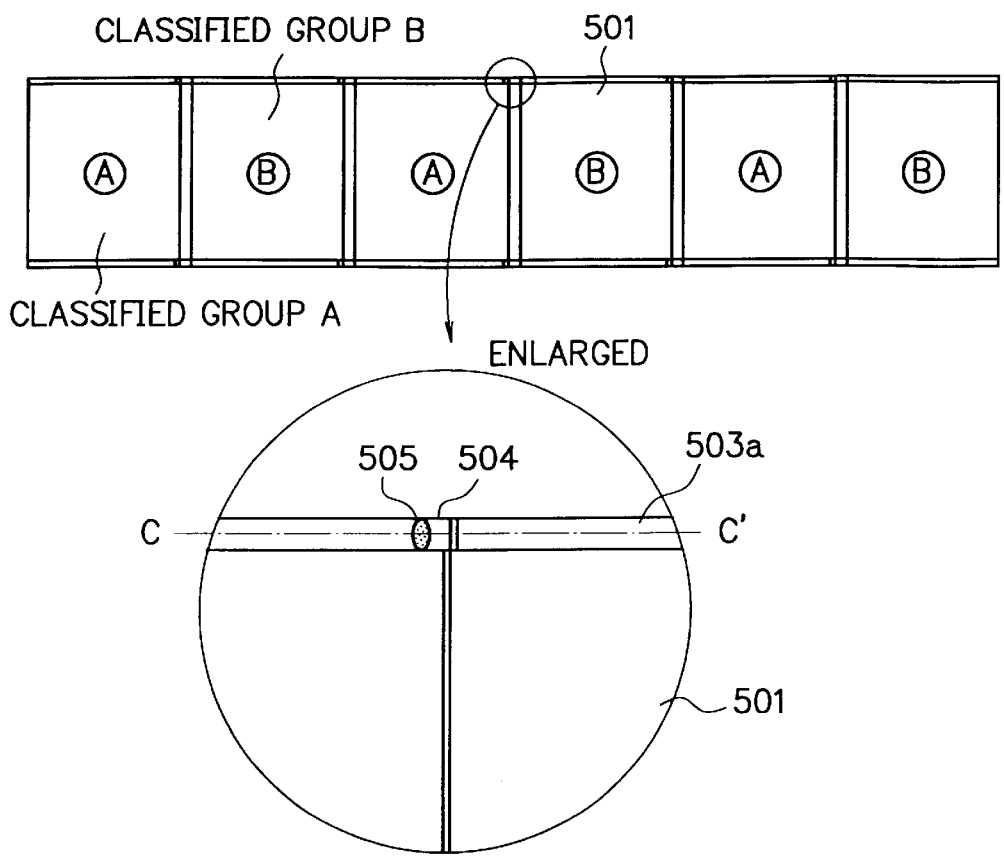
FIG. 7(A) is a schematic illustrating an example of an arrangement of a plurality of photovoltaic elements in a photovoltaic element module in the present invention.
Figure 7B:
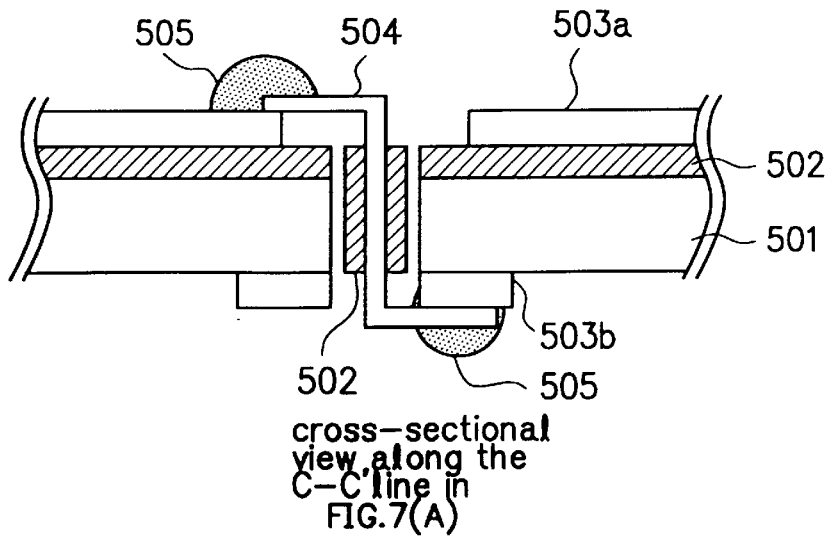
FIG. 7(B) is a schematic cross-sectional view, taken along the C–C' line in FIG. 7(A).

A process of preparing a photovoltaic element module by electrically connecting six photovoltaic elements of groups A and B with each other will be described with reference to FIGS. 7(A) and 7(B). FIG. 7(A) is a schematic plan view of said photovoltaic element module. FIG. 7(A) includes a schematically enlarged view of a part of said photovoltaic element module. FIG. 7(B) is a schematic cross-sectional view, taken along the C–C' line in FIG. 7(A).

Specifically, three photovoltaic elements from group A and three photovoltaic elements from group B were provided, and these two kinds of photovoltaic elements 501 were alternately arranged in a side-by-side linear arrangement as shown in FIG. 7(A). Thereafter, for each adjacent photovoltaic element, the positive bus bar electrode 503a of one photovoltaic element and the negative bus bar electrode 503b of the other photovoltaic element were connected using a brazing material 505 (a solder) and a serializing member 504. By this, the six photovoltaic elements were serialized into a photovoltaic element module. For the photovoltaic element module thus obtained, the copper tub connected to the bus bar electrode of the most end sided photovoltaic element was extended to the rear side of the photovoltaic element module, a copper tub having a desired length was bonded thereto, followed by providing a back electrode-outputting portion so that an output power can be through a hole of a backside sealing material which will be later described (this is not shown in the figures).

Preparation of Solar Cell Module

Figure 8A:
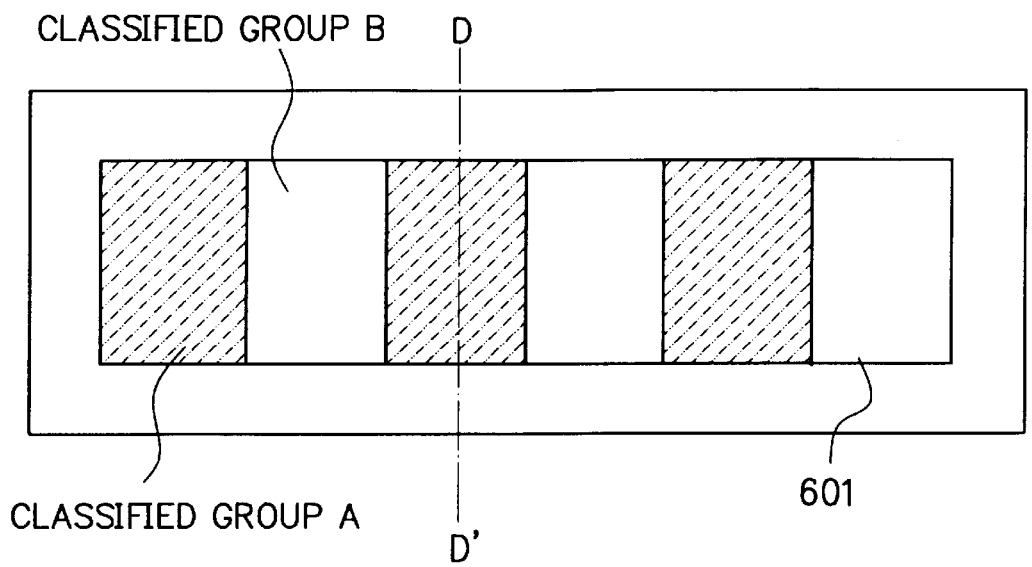
FIG. 8(A) is a schematic illustrating another example of an arrangement of a plurality of photovoltaic elements in a photovoltaic element module in the present invention.

A process of preparing a solar cell module by sealing the photovoltaic element module obtained in the above will be described with reference to FIGS. 8(A) and 8(B). FIG. 8(A) is a schematic plan view of said solar cell module, and FIG. 8(B) is a schematic cross-sectional view, taken along the D–D' line in FIG. 8(A).

Figure 8B:
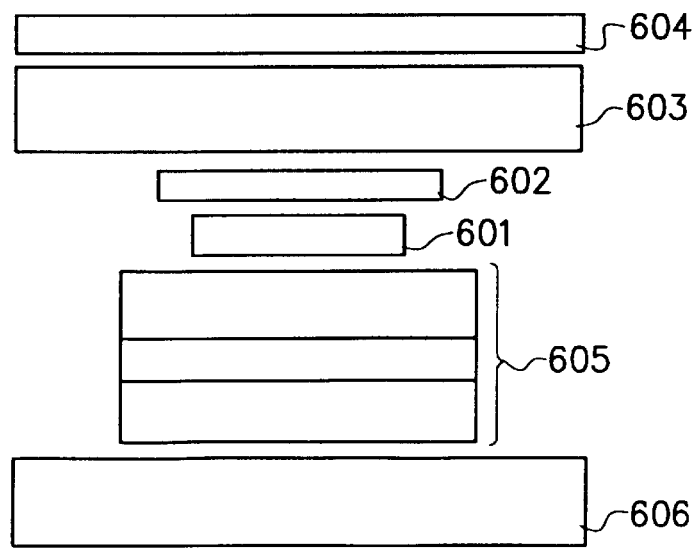
FIG. 8(B) is a schematic cross-sectional view, taken along the D–D' line in FIG. 8(A).

Specifically, there were provided a photovoltaic element module 601 (comprising the photovoltaic element module obtained in the above), a surface side protecting and reinforcing member 602, a surface side filler 603, a transparent surface protective member 604, an insulating member 605 (an insulating member whose opposite surfaces have a filler thereon), and a back face reinforcing member 606, and these were stacked in the order shown in FIG. 8(B) to obtain a stacked body.

The stacked body was introduced into a vacuum laminater of a single stage vacuuming system, where the stacked body was subjected to deaeration treatment by evacuating the inside of the vacuum laminater containing the stacked body therein for 30 minutes under conditions of 76 Torr/sec. for the exhaustion velocity and 5 Torr for the vacuum degree. Then the vacuum laminater containing the stacked body therein was transferred into a hot air oven maintained at 160° C., where the stacked body was subjected to heat treatment for 50 minutes. In this heat treatment, the fillers (EVA) in the stacked body are engaged in an environment with a temperature of more than 140° C. over more than 15 minutes, whereby the fillers are fused and crosslinked and as a result, the photovoltaic element module is resin-sealed.

After the heat treatment was completed, the vacuum laminater containing the stacked body therein was taken out from the hot air oven, followed by cooling to room temperature, and the stacked body was taken out from the vacuum laminater. Thus, there was obtained a solar cell module.

In the above, as the surface side protecting and reinforcing member 602, there was used a nonwoven glass fiber (mass per unit area: 40 g/m$^2$, thickness: 200 μm, content of adhesive acrylic resin: 4.0%, line diameter: 10 μm, fibre length: 13 mm).

As the surface side filler 603, there was used a 460 μm thick EVA sheet prepared by using a mixture of ethylene-vinyl acetate copolymer (vinyl acetate content: 25% by weight), a crosslinking agent, a UV absorber, an antioxidant, and a photostabilizer.

As the surface protective member 604, there was used a 50 μm thick nondrawn ETFE (ethylene-tetrafluoro-ethylene) film having a plasma-discharged surface to be contacted with the surface side filler.

As the backside insulating member 605, there was used a 550 μm thick three-layered film prepared by providing two prescribed EVA [comprising ethylene-vinyl acetate copolymer (vinyl acetate content: 25% by weight)] having a thickness of 225 μm and a 100 μm thick biaxial oriented PET (polyethylene terephthalate) film and stacking them in the order of EVA film/PET film/EVA film.

As the back face reinforcing member 606, there was used a 400 μm thick steel plate comprising a galvalume steel plate (an aluminum-zinc alloy coated steel plate in which 55% by weight of aluminum, 43.4% by weight of zinc and 1.6% by weight of silicon are integrated) in which one of the opposite surface is coated by a polyester series coating material and the remaining surface is coated by a polyester series coating material added with a glass fiber material.

Bending Processing of Solar Cell Module

Figure 9:
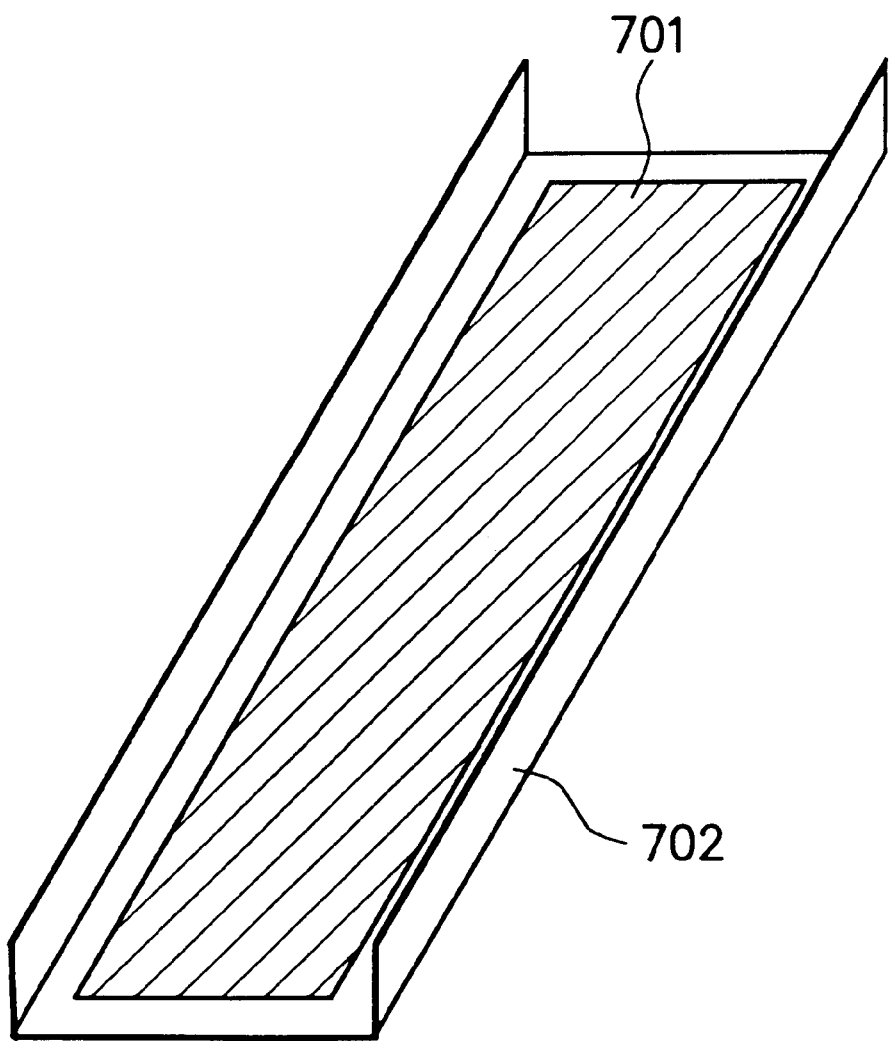
FIG. 9 is a schematic slant view illustrating an example of a solar cell module whose opposite non-power generating end portions are bent in the present invention.

The solar cell module obtained in the above was subjected to bending processing using a bender bending molding machine, where its opposite end portions 702 not containing the photovoltaic element module 701 were bent as shown in FIG. 9. The bending processing in this case was conducted by preventing a blade and the like of the bender from being contacted to the area of the solar cell module in which the photovoltaic element module is contained.

Incidentally, in this example, as above described, there was used the open-circuit voltage value (L.L.Voc) under incident intensity of 0.1 mW/cm$^2$ in the classification of the photovoltaic elements. L.L. Voc corresponds to a leakage current value and therefore, it comes to a result of indicating an amount of defective portions present in a photovoltaic element. Based on this situation, the photovoltaic elements involved are classified into those whose L.L. Voc are small and those whose L.L. Voc are large. A photovoltaic element module is prepared by coexisting these two kinds. In the case of preparing a plurality of photovoltaic element modules in this way, the resulting photovoltaic element modules are such that a variation in terms of L.L. Voc among them is small. In this case, the number of photovoltaic element modules outside the standard is diminished, resulting in an increase in the yield in the production of photovoltaic element modules.

EXAMPLE 2

The procedures of Example 1 were repeated, except that the classification of the photovoltaic elements was conducted in accordance with their light reflection spectral distribution at their surface, to prepare a solar cell module.

To classify the photovoltaic elements in accordance with their light reflection spectral distribution means that they are classified with respect to differences in their color tones. The color tone of a photovoltaic element is based on an interference color of its transparent electrode layer, semiconductor photoactive layer or back reflecting layer, and therefore, it is determined depending on the thickness of each of these layers. In this respect, to classify the photovoltaic elements on the basis of their color tone means that not only the classification is conducted in accordance with their exterior appearance but also the classification is conducted in accordance with the thickness of each of their constituent layers, that is, in accordance with their electric characteristics.

By co-existing the photovoltaic elements classified in this way, there was obtained a photovoltaic element module which is slight in terms of a variation in the electric characteristics. This situation results in an increase in the yield as well as in Example 1. And in the photovoltaic element module, since the photovoltaic elements which are different with respect to their color tone are co-existed, their color tone difference is overshadowed. Particularly in the case of installing a solar cell module on a roof or the like, it is necessary for the solar cell module to present a fine spectacle. And it is generally required to have a chrominance of less than ΔE=1. In the case of a photovoltaic element, it is difficult to satisfy this requirement.

However, by co-existing the classified photovoltaic elements as in the present invention, even when one or more of the photovoltaic elements having a chrominance which is greater than ΔE=1 should be present, their color tone difference is overshadowed as a whole. This situation enables one to establish a roof excelling in design performance.

EXAMPLE 3

As well as in Example 1, from a coil of a stainless steel web substrate (hereinafter referred to as stainless steel substrate), the stainless steel substrate was paid out to sequentially and continuously form a back reflecting layer, a semiconductor photoactive layer and a transparent electrode layer thereon. Then, the stainless substrate was cut to obtain a plurality of photovoltaic elements of 340 mm in width and 240 mm in length.

Each of the resultant photovoltaic elements was subjected to repair treatment in the same manner as in Example 1 except for the following points.

That is, as the counter electrode used in the formation of the element separation portion 209, a counter electrode having a pattern capable of conducting patterning of 1 mm at a periphery of the photovoltaic element and patterning of a width of 2 mm at a central portion of the photovoltaic element in the width direction was positioned in the aqueous solution while having an interval of 1 mm to the transparent electrode layer of the photovoltaic element in the aqueous solution, and in the same manner as in Example 1, there were formed a peripheral element separation portion 802 (see, FIG. 10) at the periphery of the photovoltaic element and a central element separation portion 802 ((see, FIG. 10) at the central portion of the photovoltaic element. By this, portions of the transparent electrode layer of the photovoltaic element which are situated in the short-circuited defects were passivated. After this, the photovoltaic element thus treated was subjected to washing with water, followed by subjecting it to drying. In this way, there was obtained a repaired photovoltaic element whose short-circuited defects had been passivated.

For the resultant photovoltaic element, as shown in FIG. 10, a PET (polyethylene terephthalate) tape 805 of 4 mm in width and 100 μm in thickness as an insulating member was bonded to the central element separation portion 802. After this, a collecting electrode 804 was formed, followed by fixing a copper tub as a negative bus bar electrode 803*b* (not shown in the figure) to the stainless steel substrate using a solder and fixing a tin foil tape as a positive bus bar electrode 803*a* to the collecting electrode 804 using a solder, thereby making the photovoltaic element have a pair of power output terminals.

Thereafter, by cutting through the PET film of the photovoltaic element, the photovoltaic element was divided into two photovoltaic elements.

In this way, there were prepared a number of complete photovoltaic elements.

The resultant photovoltaic elements were classified into group A passivating portions of the transparent electrode layer which are situated in the short-circuited defects caused upon the film formation. After this, the photovoltaic element thus treated was subjected to washing with water, followed by subjecting it to drying. In this way, there was obtained a repaired photovoltaic element whose short-circuited defects had been passivated.

On the transparent electrode of the resultant photovoltaic element, there was formed a collecting electrode 205 (a grid electrode). Then, a copper tub as the negative bus bar electrode 206*b* was fixed to the stainless steel substrate 201 using a solder and a tin foil tape as the positive bus bar electrode 206*a* was fixed to the collecting electrode using a solder, thereby making the photovoltaic element have a pair of power output terminals.

In this way, there were prepared a plurality of complete photovoltaic elements.

The resultant photovoltaic elements were classified into two groups, i.e., group A comprising those belonging to the left side of the transportation direction of the substrate when the transparent electrode layer was formed and group B comprising those belonging to the right side of the transportation direction of the substrate.

After this, in the same manner as in Example 1, there was prepared a solar cell module.

Figure 11:
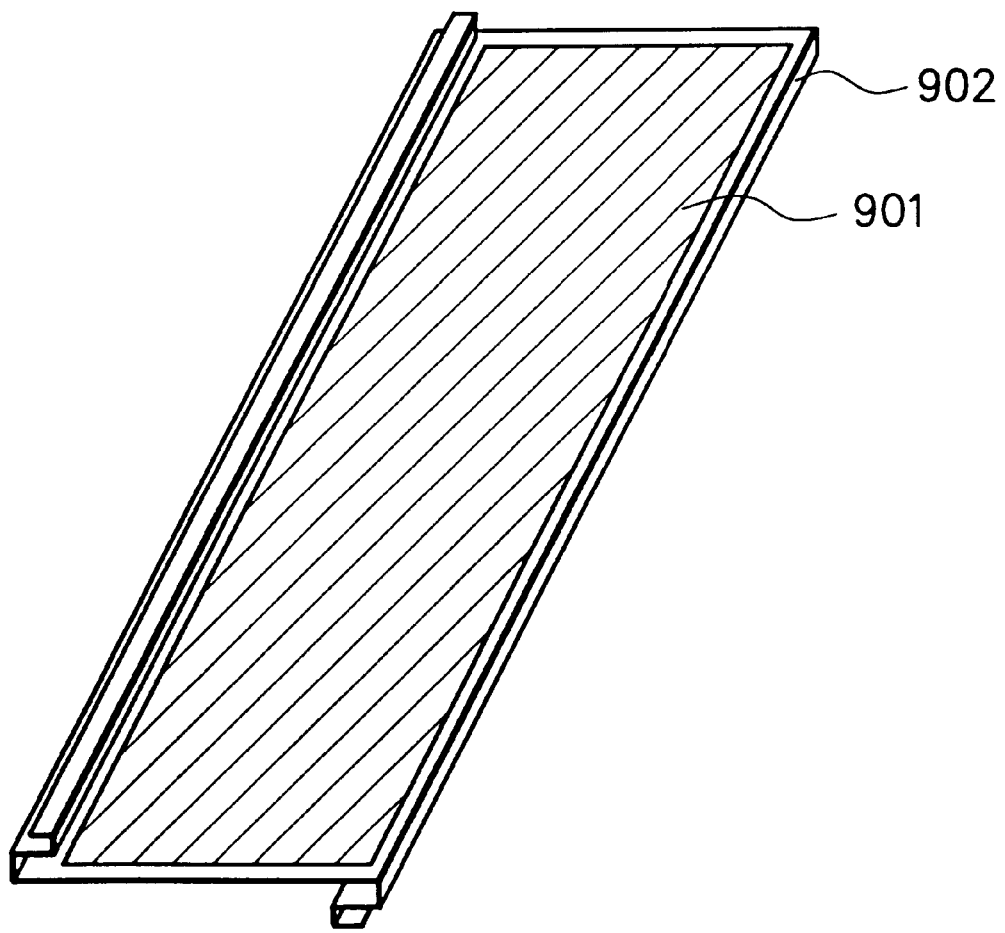
FIG. 11 is a schematic slant view illustrating another example of a solar cell module whose opposite non-power generating end portions are bent in the present invention.

The solar cell module thus obtained was subjected to bending processing using a roller former molding machine, where its opposite end portions 902 not containing the photovoltaic element module 901 were bent as shown in FIG. 11. In this case, one end portion of the solar cell module which will be situated on the side of a ridge (the left side in the figure) was bent upward to the light receiving face side and the other end portion which will be situated on the side of an eaves (the right side in the figure) was bent downward to the light receiving face side.

The bending processing in this case was conducted by preventing the roller of the molding machine from being contacted to the area of the solar cell module in which the photovoltaic element module is contained.

Incidentally, the classification method in this example is based on the position of a given photovoltaic element on the substrate. In the case of conducting film formation on a long substrate which is continuously paid out from a substrate coil, it is difficult to constantly conduct the film formation in the width direction under the same condition. In this connection, the photovoltaic elements obtained by dividing the substrate through its center which are classified depending on their position on the substrate in this example come to a result that they are classified based on a difference in the film-forming condition. As well as in Examples 1 and 2, in the case of preparing a plurality of photovoltaic element modules by co-existing these two kinds of photovoltaic elements, the resulting photovoltaic element modules are small in terms of a variation with respect to their characteristics. This situation results in an increase in the yield in the production of photovoltaic element modules. And according to the classification method in this example, a measuring equipment and a particular step in order to classify the photovoltaic elements are not necessitated, and because of this, the productivity is improved.

And, particularly in the case of using a solar cell module as a roofing material, there is a tendency that a cross roof is preferred, because it presents a fine spectacle. In this case, the width of 340 mm provides an excessive cover width, and therefore, to cut the stainless steel substrate in the width direction to obtain a photovoltaic element having a width of 170 mm which is of a narrow cover width is very desirable also in view of the form of a roofing material.

EXAMPLE 4

Description will be made of photovoltaic elements used in the production of a photovoltaic element module.

While continuously paying out a long stainless steel substrate of 340 mm in width and 0.125 mm in thickness wound in a roll form, a lower electrode layer, an a—Si solar cell having a triple structure and an upper transparent electrode (comprising ITO) were sequentially formed in this order on the stainless steel substrate. The formation of all of them was conducted by using a roll-to-roll film-forming system and in accordance with a vacuum process. The long stainless steel substrate having the lower electrode layer, the a—Si solar cell and the upper transparent electrode layer stacked thereon was cut at an interval of 250 mm to obtain a number of elements. On the upper transparent electrode layer of each of the elements, a collecting electrode in a form capable of outputting an electric power was formed. By this, there were prepared a number of photovoltaic elements having an effective power generation area of 330 mm×250 mm in size.

For each of 100 photovoltaic elements of the resultant photovoltaic elements, their characteristics were provisionally examined. The examination in this case was conducted using a solar simulator having an effective irradiation area of 350 mm×350 mm in size and a bipolar power source, where the I–V characteristics were examined.

Average characteristics of the examined I–V characteristics are as will be described below.
Average Pmax: 6.37 W
Average Vpm: 1.40 V Average Ipm: 4.55 A Of these, a variation of the Vpm is in the range of 1.31 to 1.49 V, where more than 99% of the photovoltaic elements are included in this range. A variation of the Ipm is in the range of 4.40 to 4.60 A, where more than 99% of the photovoltaic elements are included in this range.

A photovoltaic element module to be prepared comprises 5 photovoltaic elements being serialized. Therefore, in the targeted characteristics of said photovoltaic element module, the Pmax and Vpm are five times those of its each constituent photovoltaic element as will be described below.
Pmax: 6.37 W 159:25
Vpm: 1.4 V 35.000
Ipm: 4.55 A 4.55 A In the following, following the procedures previously described, the photovoltaic elements involved are classified in accordance with their characteristics.

In the classification in accordance with Vpm, the photovoltaic elements are classified in the following three groups V-1, V-2 and V-3.
V-1: in a range of beyond 1.31 V to 1.37 V
V-2: in a range of beyond 1.37 V to 1.43 V
V-3: in a range of beyond 1.43 V to 1.49 V In the classification in accordance with Ipm, the photovoltaic elements are classified in the following three groups I-1, I-2 and I-3.
I-1: in a range of beyond 4.35 A to 4.45 A
I-2: in a range of beyond 4.45 A to 4.55 A
I-3: in a range of beyond 4.55 A to 4.65 A After the photovoltaic element classification process, a process of preparing a photovoltaic element module is conducted.

In this example, this process was conducted using the apparatus shown in FIG. 1 suitable for practicing the process of preparing a photovoltaic element module in the present invention.

As above described, since the photovoltaic elements were classified into three kinds with respect to Vpm and into three kinds with respect to Ipm, there were used nine stocker's conveyers 131 (3×3=9) in the apparatus shown in FIG. 1.

And as the characteristics-measuring device 112 in the photovoltaic element-preparing apparatus shown in FIG. 1, the foregoing measuring device used in the prior measurement of the characteristics of a photovoltaic element was used, and it was installed in the photovoltaic element-preparing apparatus so that it can be operated based on a command from the computer 114. In addition, in this example, because of continuously measuring the characteristics of each of the photovoltaic elements in an in-line system, there was used a measuring stage.

FIG. 12 is a schematic view illustration of the constitution of said measuring stage. In FIG. 12, reference numeral 521 indicates a stage main body capable of going up and down by means of an arm 522.

On the stage main body 521, there is provided a lower electrode 524 through a support 523 made of an electrically insulative material. The upper face of the lower electrode 524 is made to be flat, because it serves to contact with the lower face of a photovoltaic element C and support the photovoltaic element C. Though not shown in the figure, the lower electrode 524 is electrically connected to a negative pole of a power source for measuring the I–V characteristics. In addition, in order to prevent the occurrence of mechanical buffing with a belt conveyer which will be later described, the lower electrode 524 is provided with a slit.

Reference numeral 510 indicates a solar simulator which can be opened or closed by means of a shutter (not shown) provided therein. Reference numeral 511 indicates a probe for the upper electrode. The probe 510 is provided such that it is electrically isolated from the solar simulator 510, and being not shown in the figure, it is electrically connected to a positive pole of the I–V characteristics-measuring power source. For the position of the probe 511, as shown in FIG. 12, it is designed so that a collecting electrode Cl of the photovoltaic element can be positioned on an extended line of the probe. Reference numeral 512 indicates a sensor which serves to distinguish the presence or absence of a photovoltaic element. Reference numeral 520 indicates a conveyer belt which serves to transport the photovoltaic element C toward the right direction in the figure.

The measuring stage is operated, for example, as will be described below.

The photovoltaic element C is transported from the left direction toward the right direction (in the figure) by means of the conveyer belt 520.

When the timing for the photovoltaic element to have come right above the stage 521 is judged by the sensor 512, the arm 522 is lifted, where the photovoltaic element C is raised by the lower electrode 504. When the collecting electrode Cl of the photovoltaic element is contacted with the probe 511, the lifting of the arm 522 is terminated. At this time, the positive and negative electrodes of the photovoltaic element C have electrical connection with the foregoing I–V characteristics measuring power source.

While maintaining this state, the shutter (not shown) of the simulator 510 is opened and standard light for measuring characteristics from the simulator 510 is irradiated to measure the I–V characteristics of the photovoltaic element C. After the measurement of the I–V characteristics is completed, the shutter of the simulator is closed and the arm 522 is descended. When the arm is descended, the photovoltaic element C comes to position on the belt conveyer 520 and it is transported toward the right direction in the figure.

Such sequence as above described is conducted for each photovoltaic element.

Description will be made of the module-forming apparatus 152.

In the module-forming apparatus 152, the photovoltaic elements are connected with each other in series connection as shown in FIG. 7(B), and therefore, for each adjacent photovoltaic element, a copper foil is spanned between the upper electrode layer of one photovoltaic element and the stainless steel substrate of the other photovoltaic element, followed by subjecting it to laser welding to fix the copper foil to each of the photovoltaic elements.

Now, the photovoltaic elements 108 provided are supplied from the supply device 109 and transported to the characteristics-measuring 110, where the measurement of their characteristic is conducted by the characteristics-measuring device 112. The data of the resultant characteristics is stored in the memory of the computer 114. Then, the photovoltaic elements are stocked on the corresponding stocker's conveyers 131 provided in accordance with the Vpm and Ipm.

Successively, following the previously described sequence, the synthesis of the I–V characteristic curves when five given photovoltaic elements are serialized is obtained from the photovoltaic elements involved, and five photovoltaic elements suitable as a combination which provides characteristics close to the targeted module characteristics are selected and transported to the module-forming station.

Then, the five photovoltaic elements are serialized by the module-forming apparatus 152, whereby a photovoltaic element module is completed. After this, the photovoltaic element module is subjected to lamination treatment in the same manner as in Example 1 to obtain a solar cell module.

In this way, there were obtained five solar cell modules (Modules 1 to 5). For each of the resultant solar cell modules, for the confirmation purpose, evaluation was conducted with respect to its characteristics.

In the evaluation, such solar simulator as above described can not be used because these solar cell modules are of a length of about 1250 mm. In this connection, the evaluation was conducted using a large characteristics-measuring apparatus 240A (produced by Sbyer Company of U.S.A.) capable of measuring the characteristics of a solar cell module having a length of 1300 mm.

The evaluated results are shown in Table 1. From Table 1, it is understood that the solar cell modules are very complete with respect to their characteristics Pmax, Vpm and Ipm which are very slightly varied.

As being apparent from Table 1, the average output power of the five solar cell modules is 31.7 W which is smaller than 31.85 W as the targeted output power, but this situation is due to mismatch loss based on nonconformity of the optimum working points which is caused by the serialization of the photovoltaic elements having different characteristics.

EXAMPLE 5

The procedures of Example 4 were repeated, except that in the election of a combination of the photovoltaic elements which are serialized, a simple arithmetic sum of the characteristics by selecting the corresponding stocker's conveyers was used, namely, the sequence of finding out a combination of the photovoltaic elements by using the I–V characteristic curve synthesis was omitted, to obtain five solar cell modules (Modules 1 to 5).

The resultant solar cell modules were evaluated with respect to their characteristics in the same manner as in Example 4.

The evaluated results are shown in Table 2.

In comparison with the results obtained in Example 4, the results obtained in this example are somewhat greater in terms of a variation among the characteristics. But, for instance, the variation of the Pmax is about 0.6% which is good enough. In addition, the average of the Pmax is 31.72 W which is smaller than 31.8 W as the targeted output power. But this difference corresponds to mismatch loss.

Comparative Example 1

The procedures of Example 4 were repeated, except without conducting the operation of estimating the characteristics of a photovoltaic element module when it is obtained and selecting the corresponding photovoltaic elements so that no variation occurs among photovoltaic element modules obtained with respect to their characteristics, the photovoltaic elements provided were successively dedicated in the supplied order for the serialization of obtaining a photovoltaic element module, to obtain five solar cell modules (Modules 1 to 5).

The resultant solar cell modules were evaluated with respect to their characteristics in the same manner as in Example 4.

The evaluated results are shown in Table 3.

Based on the results shown in Table 3, for instance, when a variation of the Pmax is observed, it is about ±2.6% which is undesirably greater in comparison with the targeted solar cell module characteristics.

In addition, the average output power is 31.72 W which is smaller than 31.8 W as the targeted output power. But this difference is corresponding to mismatch loss.

Comparative Example 2

The procedures of Example 4 were repeated, except that instead of selecting a combination of the five corresponding photovoltaic elements in accordance with the measured photovoltaic element characteristics and serializing them, only the photovoltaic elements which are very complete with respect to their characteristic were subjected to serialization while treating other photovoltaic elements as defectives, to obtain five solar cell modules.

In the above, the characteristics ranges for such good photovoltaic elements were made as follows.
Vpm: a range of from 1.38 V to 1.42 V
Ipm: a range of from 4.53 A to 4.57 A
And only those photovoltaic elements in these ranges were selected and subjected to serialization.

The solar cell modules obtained in the above were evaluated with respect to their characteristics in the same manner as in Example 4. As a result, it was found that a variation among the solar cell modules with respect to their characteristics is very small as well as in Example 4.

However, of the photovoltaic elements supplied for the production of a solar cell module, only 43% of them could satisfy the above characteristics ranges. That is, the proportion of the non-defectives was only 43%.

EXAMPLE 6

The five solar cell modules prepared in Example 4 were serialized to obtain a solar cell module string.

Since the average output power of the five solar cell modules prepared in Example 4 was 31.75 W, the targeted string output power was made to be 158.8 W which is about 5 times said 31.75 W.

The solar cell module string in this example is systemized to have a length of about 6.25 m, and because of this, to directly and precisely conduct the measurement of the string characteristics is difficult in practice.

In this connection, by employing the previously described calculation method of synthesizing the I–V characteristic curves, the string characteristics were obtained by way of calculation. The results obtained were as follows.
Pmax(W): 158.7
Vpm(V): 34.88
Ipm(A): 4.55

This value is extremely closer to the targeted output power. In this respect, it is understood that substantially no mismatch loss occurs when the solar cell modules are serialized into a solar cell module string.

EXAMPLE 7

In accordance with the procedures of preparing the solar cell module, there were prepared 25 solar cell modules are obtained.

By serializing every five of the 25 solar cell modules, five systemized solar cell module strings (Strings 1 to 5) having a length of about 6.25 m.

For each of these solar cell module strings, evaluation was conducted with respect to its characteristics in the same manner as in Example 6.

The evaluated results are shown in Table 4.

From Table 4, it is understood that any of the characteristics Pmax, Vpm and Ipm is somewhat slightly varied among the strings but it is desirably complete among them. And the average output power of the strings was found to be 158.5 W as shown in Table 4.

EXAMPLE 8

The five solar cell module strings prepared in Example 7 were electrically connected with each other in parallel connection to obtain a solar cell module array.

Since the average output power of the five solar cell module strings prepared in Example 7 was 158.5 W, the targeted array output power was made to be 793 W which is about 5 times said 158.5 W.

To directly and precisely conduct the measurement of the array characteristics is difficult in practice. In this connection, by employing the previously described calculation method of synthesizing the I–V characteristic curves, the array characteristics were obtained by way of calculation. The results obtained were as follows.
Pmax (W): 792
Vpm(V): 34.89
Ipm(A): 22.7

This value is extremely closer to the targeted output power. In this respect, it is understood that substantially no mismatch loss occurs when the solar cell module strings are connected with each other in parallel connection into a solar cell module array.

Incidentally, not only a solar cell module but also a solar cell module array in the present invention can be constituted as shown in FIG. 13. Specifically, a plurality of solar cell modules 1302 each comprising a plurality of photovoltaic elements are serialized to form a solar cell module string 1303. A plurality of such solar cell module strings are connected with each other in parallel connection to form a solar cell module array 1304. The output power of the solar cell module array is transmitted to an inverter or the like.

As described in the above description, according to the present invention, it is possible to mass-produce a number of solar cell modules whose variation in terms of property and attribute is slight at an improved yield. In addition, by co-existing classified photovoltaic elements, it is possible to mass-produce a number of solar cell modules whose variation in terms of color tone is overshadowed and which can be made into a roofing material integral type solar cell module.

Further, it is possible to prevent occurrence of the period of time and expenses in the process control which are necessitated in order to satisfy the requirement that all the photovoltaic elements be used in the production of a solar cell module array. In addition, it is possible to prevent occurrence of the period of time and expenses required in the case of treating the photovoltaic element outside the standard.

The above situation leads to reducing the cost of a product such as a solar cell module, a solar cell module string or a solar cell module array.

TABLE 1

|  | Pmax (W) | Vpm (V) | Ipm (A) |
|---|---|---|---|
| Module 1 | 31.78 | 7.03 | 4.52 |
| Module 2 | 31.76 | 6.98 | 4.55 |
| Module 3 | 31.73 | 6.99 | 4.54 |
| Module 4 | 31.78 | 6.97 | 4.56 |
| Module 5 | 31.71 | 7.00 | 4.53 |
| Average | 31.75 | | |

TABLE 2

|  | Pmax (W) | Vpm (V) | Ipm (A) |
|---|---|---|---|
| Module 1 | 31.62 | 6.98 | 4.53 |
| Module 2 | 31.78 | 7.00 | 4.54 |
| Module 3 | 31.82 | 7.04 | 4.52 |
| Module 4 | 31.75 | 7.01 | 4.53 |
| Module 5 | 31.64 | 6.97 | 4.54 |
| Average | 31.72 | | |

TABLE 3

|  | Pmax (W) | Vpm (V) | Ipm (A) |
|---|---|---|---|
| Module 1 | 31.46 | 6.99 | 4.50 |
| Module 2 | 30.94 | 6.89 | 4.49 |
| Module 3 | 31.20 | 6.92 | 4.51 |
| Module 4 | 32.45 | 7.07 | 4.59 |
| Module 5 | 32.54 | 7.03 | 4.63 |
| Average | 31.72 | | |

TABLE 4

|  | Pmax (W) | Vpm (V) | Ipm (A) |
|---|---|---|---|
| String 1 | 158.7 | 34.88 | 4.55 |
| String 2 | 158.1 | 34.90 | 4.53 |
| String 3 | 158.8 | 34.83 | 4.56 |
| String 4 | 158.9 | 34.84 | 4.56 |
| String 5 | 158.2 | 34.85 | 4.54 |
| Average | 158.5 | | |

What is claimed is:

1. A process for producing a solar cell module comprising at least a photovoltaic element module, said process comprising, in the listed order, the steps of:

providing photovoltaic elements which are different from each other in property and attribute due to variation in a production process used to make said photovoltaic elements;

identifying or classifying said photovoltaic elements into a plurality of groups which are different from each other in property and attribute;

selecting at least two kinds of photovoltaic elements having different property and attribute from said plurality of groups based on an estimation of characteristics of a photovoltaic element module to be formed; and forming said photovoltaic element module by electrically connecting said selected at least two kinds of photovoltaic elements.

2. The process according to claim 1, wherein the identification or classification in terms of property and attribute is conducted in accordance with short-circuit current values of the photovoltaic elements.

3. The process according to claim 1, wherein the identification or classification in terms of property and attribute is conducted in accordance with open-circuit voltage values of the photovoltaic elements.

4. The process according to claim 1, wherein the identification or classification in terms of property and attribute is conducted in accordance with maximum output voltage values of the photovoltaic elements.

5. The process according to claim 1, wherein the identification or classification in terms of property and attribute is conducted in accordance with shunt resistance values of the photovoltaic elements.

6. The process according to claim 5, wherein the shunt resistance value is an open-circuit voltage value when an incident intensity is less than 5 mW/cm$^2$.

7. The process according to claim 1, wherein the identification or classification in terms of property and attribute is conducted in accordance with series resistance values of the photovoltaic elements.

8. The process according to claim 1, wherein the identification or classification in terms of property and attribute is conducted in accordance with fill factor values of the photovoltaic elements.

9. The process according to claim 1, wherein the identification or classification in terms of property and attribute is conducted in accordance with light reflection spectral distributions of the photovoltaic elements.

10. The process according to claim 9, wherein light reflection spectral distributions of the photovoltaic elements are color tones of said photovoltaic elements.

11. The process according to claim 1, wherein the photovoltaic elements have a transparent electrode layer on their light receiving face side, and the identification or classification in terms of property and attribute is conducted in accordance with thickness of said transparent electrode layer.

12. The process according to claim 1, wherein the photovoltaic elements have a reflection preventive layer on their light receiving face side, and the identification or classification in terms of property and attribute is conducted in accordance with thickness of said reflection preventive layer.

13. The process according to claim 1, wherein the photovoltaic elements have a semiconductor photoactive layer on their light receiving face side, and the identification or classification in terms of property and attribute is conducted in accordance with thickness of said semiconductor photoactive layer.

14. The process according to claim 1, wherein the photovoltaic elements have a back reflecting layer on their light receiving face side, and the identification or classification in terms of property and attribute is conducted in accordance with thickness of said back reflecting layer.

15. The process according to claim 1, wherein the photovoltaic elements comprise photovoltaic elements formed by a continuous treatment system.

16. The process according to claim 15, wherein the continuous treatment system is a roll-to-roll system of forming a photovoltaic element on an elongated substrate.

17. The process according to claim 1, wherein the photovoltaic elements comprise photovoltaic elements formed by a batch treatment system.

18. The process according to claim 16, wherein the photovoltaic elements comprise photovoltaic elements obtained by dividing the photovoltaic element formed on the elongated substrate at intervals in a direction in which the elongated substrate is transported.

19. The process according to claim 18, wherein the divided photovoltaic elements are identified or classified in accordance with their positions on the elongated substrate before photovoltaic element formed on the elongated substrate is divided.

20. The process according to claim 1, wherein the photovoltaic elements comprise photovoltaic elements formed in a plurality of photovoltaic element-forming apparatuses in which the same treatment is capable of being concurrently conducted, and the identification or classification in terms of property and attribute is conducted in accordance with said apparatuses used for the formation said photovoltaic elements.

21. The process according to claim 1, wherein when a plurality of photovoltaic element modules are formed in the photovoltaic element module-forming step, said photovoltaic element modules are formed by co-existing different photovoltaic elements in each of said photovoltaic element modules so that all the photovoltaic element modules have a uniform property.

22. The process according to claim 1, wherein two kinds of photovoltaic elements which are different from each other in terms of property and attribute are co-existed in the photovoltaic element module in a half-and-half proportion.

23. The process according to claim 1, wherein photovoltaic elements which are different in terms of property and attribute are co-existed in the photovoltaic element module such that adjacent photovoltaic elements are different from each other in terms of property and attribute.

24. The process according to claim 1 further comprising a step of sealing the photovoltaic element module by a sealing resin and bonding a reinforcing member to a non-light receiving face side of said photovoltaic element module.

25. The process according to claim 1, wherein the solar cell module is a building material integral solar cell module.

26. The process according to claim 1, wherein an I–V characteristic curve synthesis method is used in the estimation.

27. The process according to claim 1, wherein said step of providing photovoltaic elements includes a step of excluding photovoltaic elements whose measured property is outside a prescribed range.

28. The process according to claim 1, wherein a simple arithmetic sum or a simple average value with respect to at least one measured parameter for said selected at least two kinds of photovoltaic elements is close to each other.

* * * * *

UNITED STATES PATENT AND TRADEMARK OFFICE
CERTIFICATE OF CORRECTION

PATENT NO. : 6,265,242 B1
DATED : July 24, 2001
INVENTOR(S) : Ayako Komori et al.

It is certified that error appears in the above-identified patent and that said Letters Patent is hereby corrected as shown below:

Column 4,
Line 65, "their" should read -- with their --.

Column 8,
Lines 45 and 50, "schematic" should read -- schematic view --.

Column 9,
Line 53, "measurement" should read -- Measurement --; and
Line 54, ""measurement and evaluation"]." should read -- "Measurement and Evaluation"]. --.

Column 11,
Line 15, "conveyer 131." should read -- conveyer 131 --;
Lines 33, 34 and 38, "computer 141" should read -- computer 114 --; and
Line 60, "nest" should read -- next --.

Column 14,
Line 56, "programed" should read -- programmed --.

Column 19,
Line 23, "to" should read -- with respect to --.

Column 20,
Line 7, "cc-existing" should read -- co-existing --.

Column 21,
Line 11, "maybe" should read -- may be --.

Column 22,
Line 67, "$10^{-2}(1/\Omega\ cm)$." should read -- $10^{-2}(1/\Omega\ cm)$. --.

Column 23,
Line 61, "whereby" should read -- thereby --.

Column 25,
Line 28, "Member 403" should read -- Member 404 --.

Column 27,
Line 55, "layer 201," should read -- layer 202, --;
Line 64, "(pc-Si)" should read -- ($\mu$c-Si) --; and
Line 65, "pc-Si" should read -- $\mu$c-Si --.

UNITED STATES PATENT AND TRADEMARK OFFICE
CERTIFICATE OF CORRECTION

PATENT NO.  : 6,265,242 B1
DATED       : July 24, 2001
INVENTOR(S) : Ayako Komori et al.

It is certified that error appears in the above-identified patent and that said Letters Patent is hereby corrected as shown below:

Column 28,
Line 3, "$SiH_4$ $_{BF3}$," should read -- $SiH_4$, $BF_3$, --;
Line 6, "$In_2O_3$," should read -- $In_2O_3$ --;
Line 33, "whereby" should read -- thereby --; and
Line 34, "are" should read -- which are --.

Column 29,
Line 64, "fibre" should read -- fiber --.

Column 31,
Line 44, "((see," should read -- (see, --.

Column 32,
Line 60, "a" should be deleted.

Column 33,
Line 19, "was" should read -- were --; and
Line 36, "Average" (second occurrence) should read -- ¶Average --.

Column 34,
Line 37, "probe 510" should read -- probe 511 --; and
Line 36, "electrode 504." should read -- electrode 524. --.

Column 35,
Line 19, "characteristics-measuring 110," should read -- characteristics-measuring station 110, --;
Line 20, "characteristic" should read -- characteristics --; and
Line 63, "election" should read -- selection --.

Column 37,
Line 23, "modules are" should read -- modules. --; and
Line 24, "obtained." should be deleted.

UNITED STATES PATENT AND TRADEMARK OFFICE
CERTIFICATE OF CORRECTION

PATENT NO.    : 6,265,242 B1
DATED         : July 24, 2001
INVENTOR(S)   : Ayako Komori et al.

It is certified that error appears in the above-identified patent and that said Letters Patent is hereby corrected as shown below:

<u>Column 40,</u>
Line 21, "before" should read -- before the --; and
Line 30, "said" should read -- of said --.

Signed and Sealed this

Twenty-seventh Day of August, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,265,242 B1
DATED         : July 24, 2001
INVENTOR(S)   : Ayako Komori et al.

It is certified that error appears in the above-identified patent and that said Letters Patent is hereby corrected as shown below:

Column 3,
Line 28, "each" (first occurrence) should be deleted.

Column 15,
Lines 65 and 67, "low." should read -- 10W. --; and

Column 37,
Line 26, "five" (second occurrence) should read -- there were obtained five --.

Signed and Sealed this

Twenty-fifth Day of March, 2003

JAMES E. ROGAN
*Director of the United States Patent and Trademark Office*